(12) United States Patent
Manipatruni et al.

(10) Patent No.: US 10,910,556 B2
(45) Date of Patent: Feb. 2, 2021

(54) MAGNETIC AND SPIN LOGIC DEVICES BASED ON JAHN-TELLER MATERIALS

(71) Applicant: Intel Corporation, Santa Clara, CA (US)

(72) Inventors: Sasikanth Manipatruni, Hillsboro, OR (US); Ian A. Young, Portland, OR (US); Dmitri E. Nikonov, Beaverton, OR (US); Ravi Pillarisetty, Portland, OR (US); Uygar E. Avci, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 156 days.

(21) Appl. No.: 16/081,001

(22) PCT Filed: Mar. 29, 2016

(86) PCT No.: PCT/US2016/024761
§ 371 (c)(1),
(2) Date: Aug. 29, 2018

(87) PCT Pub. No.: WO2017/171730
PCT Pub. Date: Oct. 5, 2017

(65) Prior Publication Data
US 2019/0036018 A1    Jan. 31, 2019

(51) Int. Cl.
*H01L 43/10* (2006.01)
*G11B 5/73* (2006.01)
(Continued)

(52) U.S. Cl.
CPC ............ *H01L 43/10* (2013.01); *G11B 5/72* (2013.01); *G11B 5/73* (2013.01); *G11C 11/161* (2013.01); *H01F 10/3236* (2013.01)

(58) Field of Classification Search
None
See application file for complete search history.

(56) References Cited

U.S. PATENT DOCUMENTS 5,750,270 A * 5/1998 Tang ............... G11B 5/1278
428/611
6,015,632 A * 1/2000 Chambliss ............ B32B 15/018
360/324

(Continued)

FOREIGN PATENT DOCUMENTS

JP     2004054542    2/2004
KR    1020100088692  8/2010

OTHER PUBLICATIONS

Martin et al. (Appl. Surf. Sci., 188, 90-96, 2002). (Year: 2002).*

(Continued)

*Primary Examiner* — Kevin M Bernatz
(74) *Attorney, Agent, or Firm* — Green, Howard & Mughal LLP

(57) ABSTRACT

Described is an apparatus which comprises: a heat spreading layer; a first transition metal layer adjacent to the heat spreading layer; and a magnetic recording layer adjacent to the first transition metal layer. Described is an apparatus which comprises: a first electrode; a magnetic junction having a free magnet; and one or more layers of Jahn-Teller material adjacent to the first electrode and the free magnet of the magnetic junction.

17 Claims, 22 Drawing Sheets

(51) Int. Cl.
*G11C 11/16* (2006.01)
*H01F 10/32* (2006.01)
*G11B 5/72* (2006.01)

(56) References Cited

U.S. PATENT DOCUMENTS

| | | | |
|---|---|---|---|
| 8,084,127 B2 | 12/2011 | Shimizu et al. | |
| 9,159,358 B1* | 10/2015 | Hutchins | H05K 999/99 |
| 2005/0058854 A1* | 3/2005 | Takekuma | G11B 5/667 |
| | | | 428/832.2 |
| 2008/0188165 A1* | 8/2008 | Sakaguchi | B24B 19/028 |
| | | | 451/259 |
| 2010/0007990 A1* | 1/2010 | Kawai | G11B 5/855 |
| | | | 360/135 |
| 2010/0033873 A1* | 2/2010 | Ishibashi | G11B 5/7379 |
| | | | 360/135 |
| 2010/0259846 A1* | 10/2010 | Hauet | G11B 5/746 |
| | | | 360/55 |
| 2013/0084468 A1* | 4/2013 | Albrecht | G11B 5/855 |
| | | | 428/836 |
| 2014/0043947 A1* | 2/2014 | Hohlfeld | G11B 5/7325 |
| | | | 369/13.4 |
| 2014/0103469 A1* | 4/2014 | Jan | H01F 41/307 |
| | | | 257/421 |
| 2014/0306303 A1* | 10/2014 | Moriyama | H01F 10/3286 |
| | | | 257/421 |
| 2015/0138938 A1 | 5/2015 | Toshiba | |
| 2017/0373246 A1* | 12/2017 | Wang | H01F 10/3286 |

OTHER PUBLICATIONS

International Search Report and Written Opinion for PCT/US16/24761 dated Dec. 28, 2016, 14 pages.
International Preliminary Report on Patentability dated Oct. 11, 2018 for PCT Patent Application No. PCT/US2016/024761.

* cited by examiner

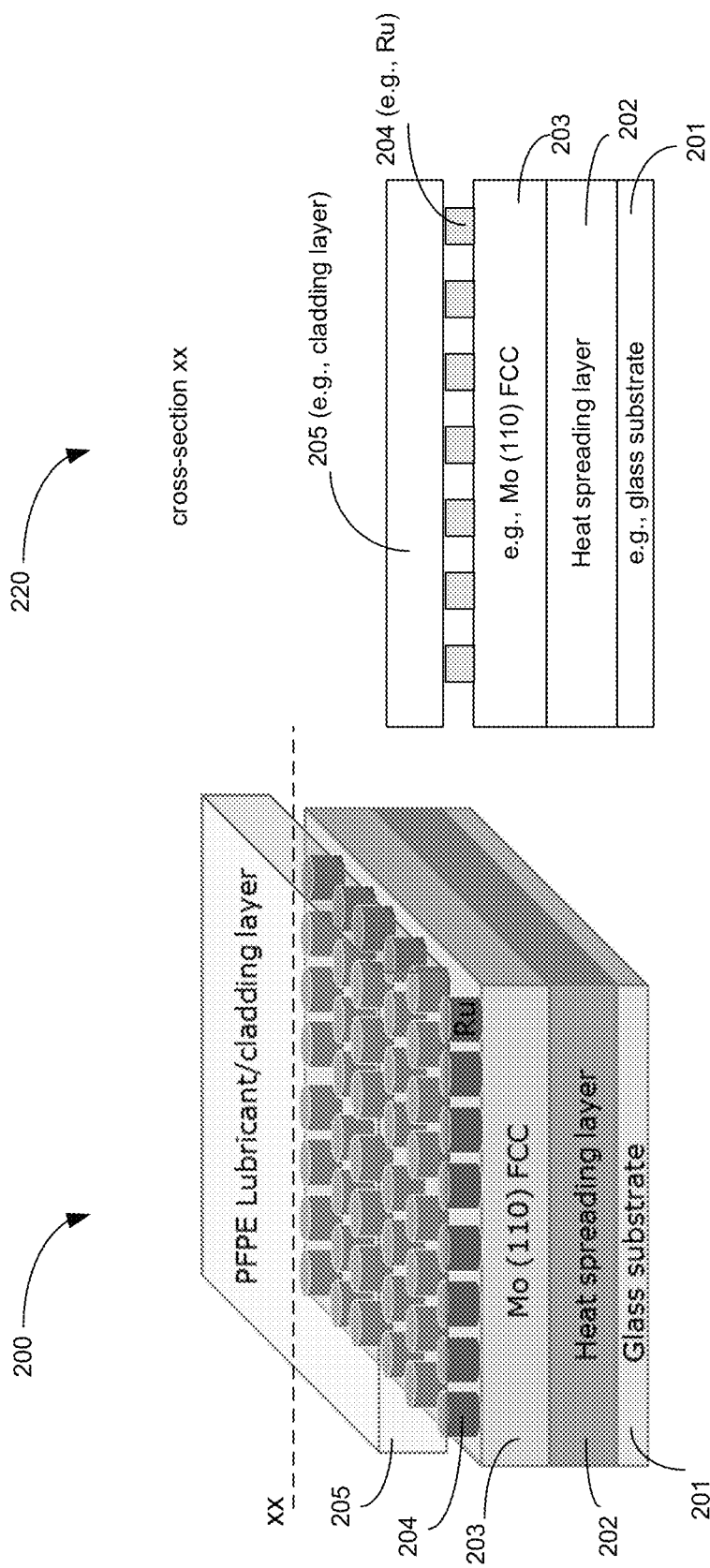

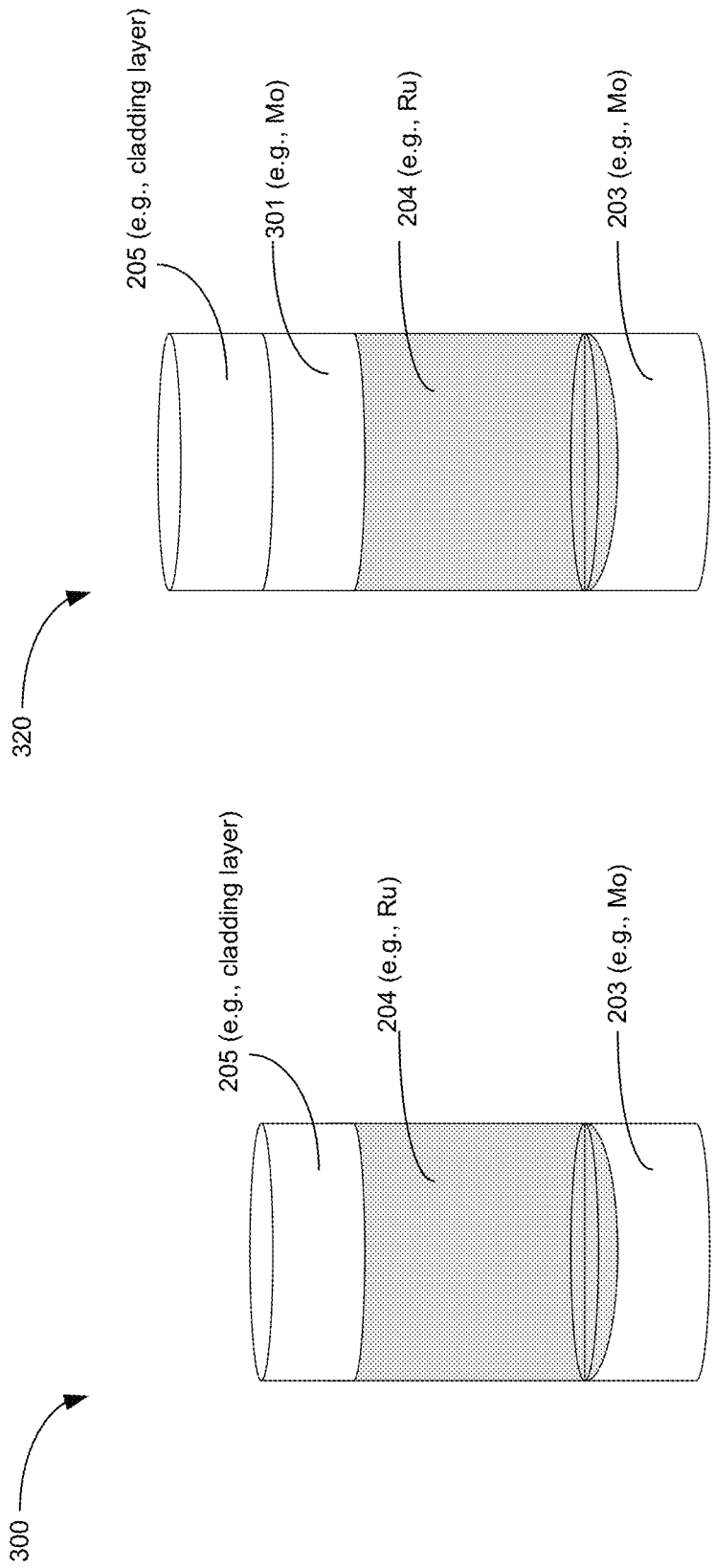

MAGNETIC AND SPIN LOGIC DEVICES BASED ON JAHN-TELLER MATERIALS

CLAIM OF PRIORITY

This Application is a National Stage Entry of, and claims priority to, PCT Application No. PCT/US16/24761, filed on 29 Mar. 2016 and titled "MAGNETIC AND SPIN LOGIC DEVICES BASED ON JAHN-TELLER MATERIALS," which is incorporated by reference in its entirety for all purposes.

BACKGROUND

Ferromagnetic, ferro-electric, and ferro-elastic phenomena can enable new class of devices for beyond Complementary Metal Oxide Semiconductor (CMOS) where non-volatility is enabled via remnant magnetization in ferromagnets, remnant polarization in ferro-electric devices, and remnant strain in ferro-elastic devices. However, current materials used for forming ferromagnets, ferro-electric devices, and ferro-elastic devices suffer from low magnetic anisotropy ($H_k$) and high magnetization ($M_s$) for spin torque logic, low polarization, and low electrical response to strain.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 2A-B illustrate a three-dimensional (3D) view and corresponding cross-section, respectively, of a magnetic memory hard-disk drive (HDD) using J-T materials to increase magnetic anisotropy ($H_k$), according to some embodiments of the disclosure.

FIGS. 3A-B illustrate two embodiments of the magnetic elements in the HDD.

DETAILED DESCRIPTION

Various embodiments describe devices such as hard disk drives (HDDs), spin logic devices, and magnetic junctions that apply Jahn-Teller (J-T) Distortion to increase magnetic anisotropy $H_k$ and lower magnetization $M_s$. For example, a hard disk drive is described that comprises: a heat spreading layer; a first transition metal layer (e.g., Mo, Pd, Cr, or CoCrPt) adjacent to the heat spreading layer; and a recording layer (e.g., Ru, Pt, or Pd) adjacent to the transition metal layer, wherein the transition metal layer is to interact with the transition metal layer causing J-T distortion. Magnetic saturation $M_s$ is generally the state reached when an increase in applied external magnetic field H cannot increase the magnetization of the material (e.g., total magnetic flux density B substantially levels off). Here, sufficiently low $M_s$ refers to $M_s$ less than 200 kA/m (kilo-Amperes per meter). Anisotropy $H_k$ generally refers to the material property which is directionally dependent. Materials with $H_k$ are materials with material properties that are highly directionally dependent. Here, sufficiently high $H_k$ in context of Heusler alloys is considered to be greater than 2000 Oe (Oersted).

The J-T effect is a geometric distortion of a non-linear molecular structure that changes its symmetry and energy.

J-T distortion is typically observed among octahedral complexes (e.g., 6 electron groups) where the two axial bonds (e.g., along the z-axis) can be shorter or longer than those of the equatorial bonds (e.g., along the x-axis and/or y-axis). When two axial bonds become longer, that phenomenon is generally referred to as elongation, and when the two axial bonds become shorter, that phenomenon is generally referred to as compression. This distortion effect can also be observed in tetrahedral compounds (e.g., compounds with 4 electron groups). This distortion effect is dependent on the electronic state of the system. For example, the J-T distortion effect is dependent on the electronic configuration of an atom or molecule in view of its orbital approximation.

In essence, any non-linear molecular system in a degenerate electronic state may be unstable and may undergo distortion to form a system of lower symmetry and lower energy, thus removing the degeneracy. Transition metals (e.g., d-block elements of groups 3-12 of the periodic table), correlated oxide materials, and Fullerene based molecules with octahedral complexes show this behavior. The lower symmetry removes the degeneracy and reduces the energy of the molecule or the crystal.

So as not to obscure the various embodiments, FIGS. 1A-E provide a high level description of J-T distortion that increase magnetic anisotropy $H_k$ and lower magnetization $M_s$. The remaining figures use J-T distortion to increase magnetic anisotropy $H_k$ and/or lower magnetization $M_s$.

Figure 1A:
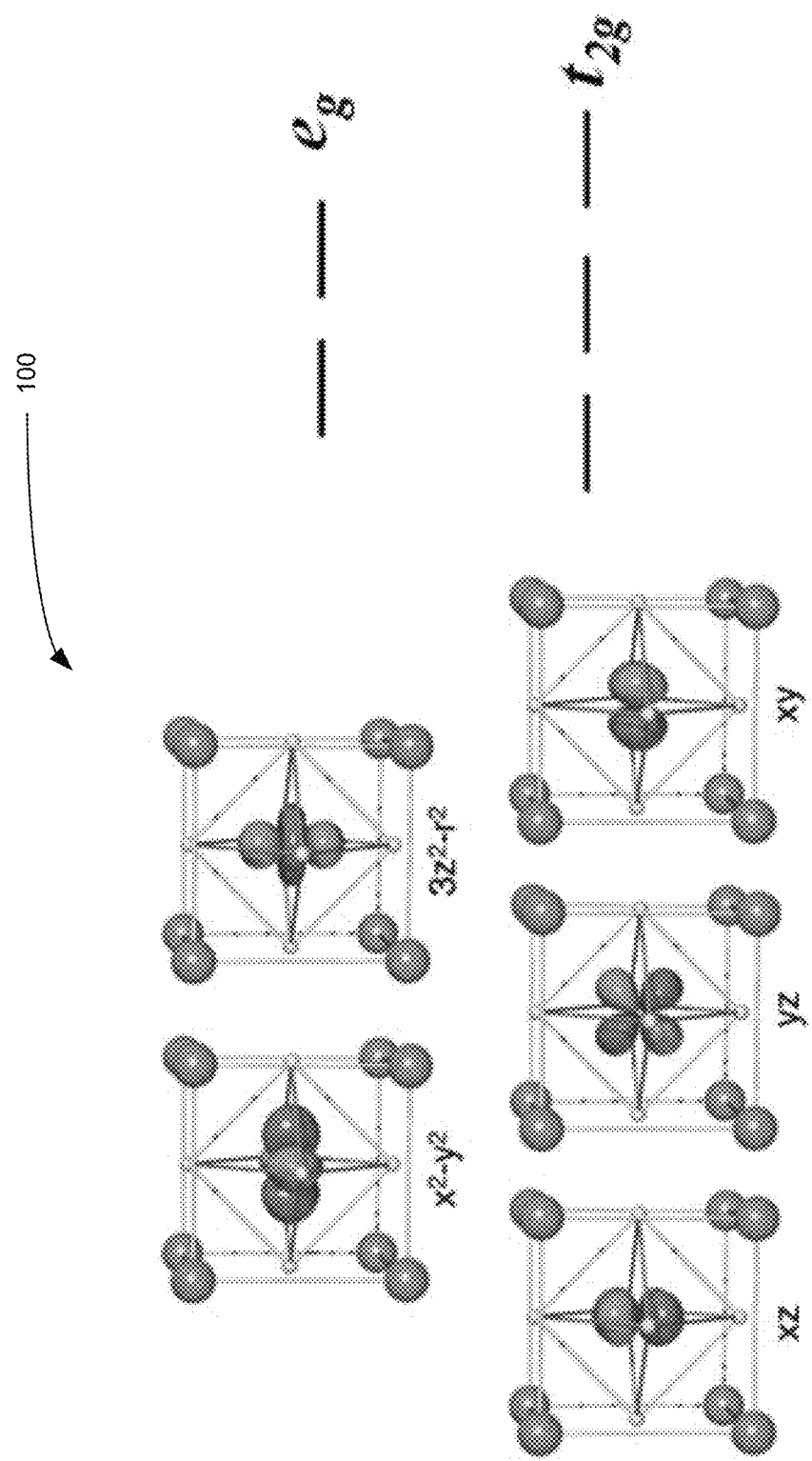
FIG. 1A illustrates d-orbitals (of 3d, 4d, 5d, or 6d shells) which are Eigen-energy solutions of Schrodinger equation.

FIG. 1A illustrates d-orbitals 100 (of 3d, 4d, 5d, or 6d shells) which are Eigen-energy solutions of Schrodinger equation. For an isotropic environment, all 5 d-orbitals would have been degenerate (have the same energy). In the presence of other atoms (or ligands, e.g., atoms of oxygen) in a molecule having an octahedral symmetry (a so-called octahedral complex), or ligands in a crystal with octahedral symmetry (producing the crystal field), the d-orbitals are split into two degenerate groups of orbitals: $t_{2g}$ having 3 orbitals ($d_{xz}$, $d_{yz}$, and $d_{xy}$) and $e_g$ having 2 orbitals ($d_{z^2}$ and $d_{(x^2-y^2)}$). The Jahn-Teller (J-T) effect originates from octahedral arrangement of atoms or ions being unstable (for certain number of electrons, 4, 7, or 9, occupying the shell) and comprises a lower-symmetry state with a distortion of positions and relative angles of ligands. In this case the $t_{2g}$ and $e_g$ groups further split into non-degenerate d-orbitals.

Figures 1B, 1C:
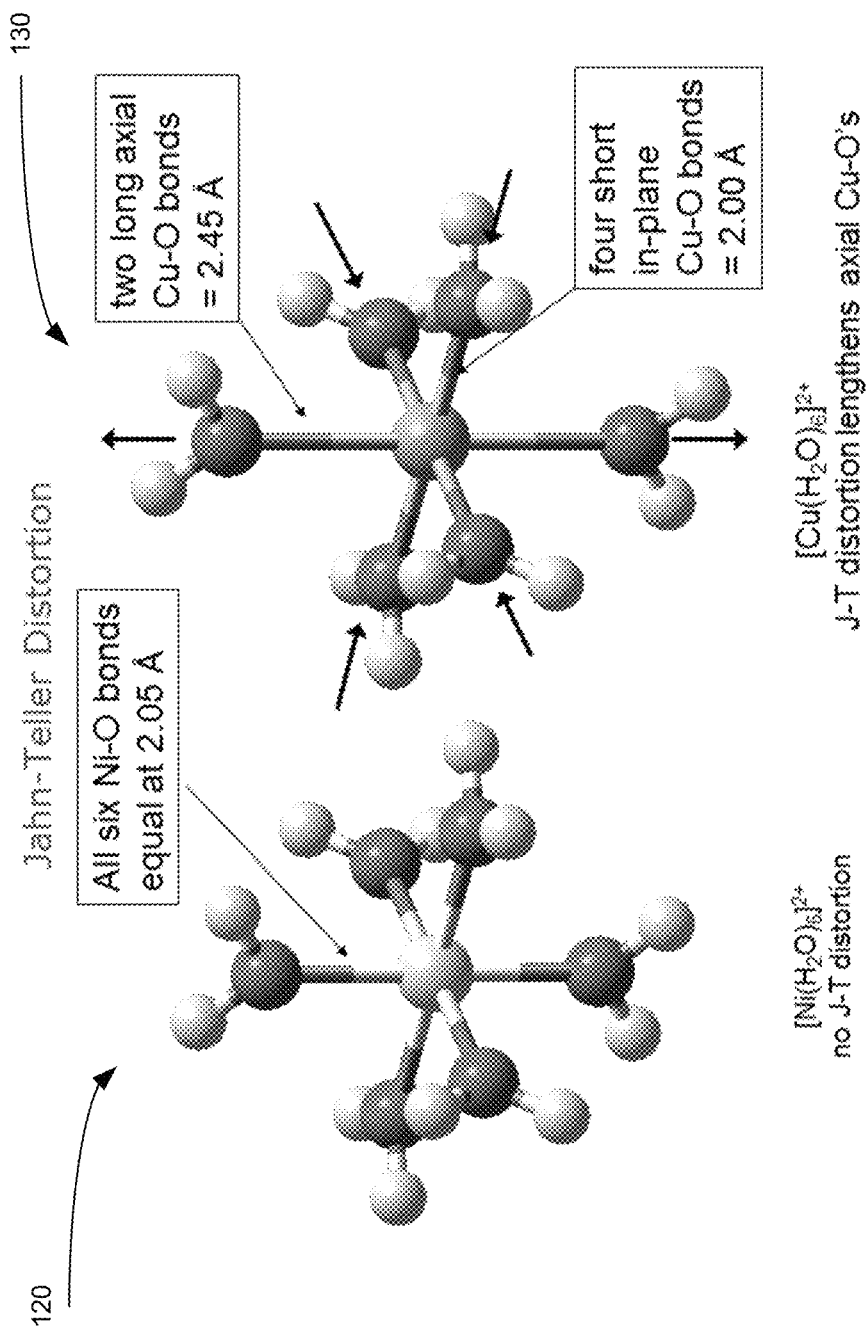
FIG. 1B illustrates an octahedral molecule of Ni—O bonds without Jahn-Teller (J-T) distortion.
FIG. 1C illustrates an octahedral molecule of Cu—O bonds with J-T distortion.

FIG. 1B illustrates octahedral molecule 120 of Ni—O bonds without J-T distortion. Here, all six Ni—O bonds have the same dimensions (e.g., 2.05 A°). For example, Ni—O equatorial bonds and the Ni—O axial bonds are of the same dimension in the absence of J-T distortion. FIG. 1C illustrates octahedral molecule 130 of Cu—O bonds with J-T distortion. Here, the four Cu—O equatorial bonds are shorter compared to the two Cu—O axial bonds. For example, the four in-plane Cu—O equatorial bonds have the same dimension (e.g., 2.00 A°) while the two long axial Cu—O bonds have longer dimensions (e.g., 2.45 A°) due to J-T distortion. In this example, J-T distortion results in elongation of the axial bonds.

Figure 1D:
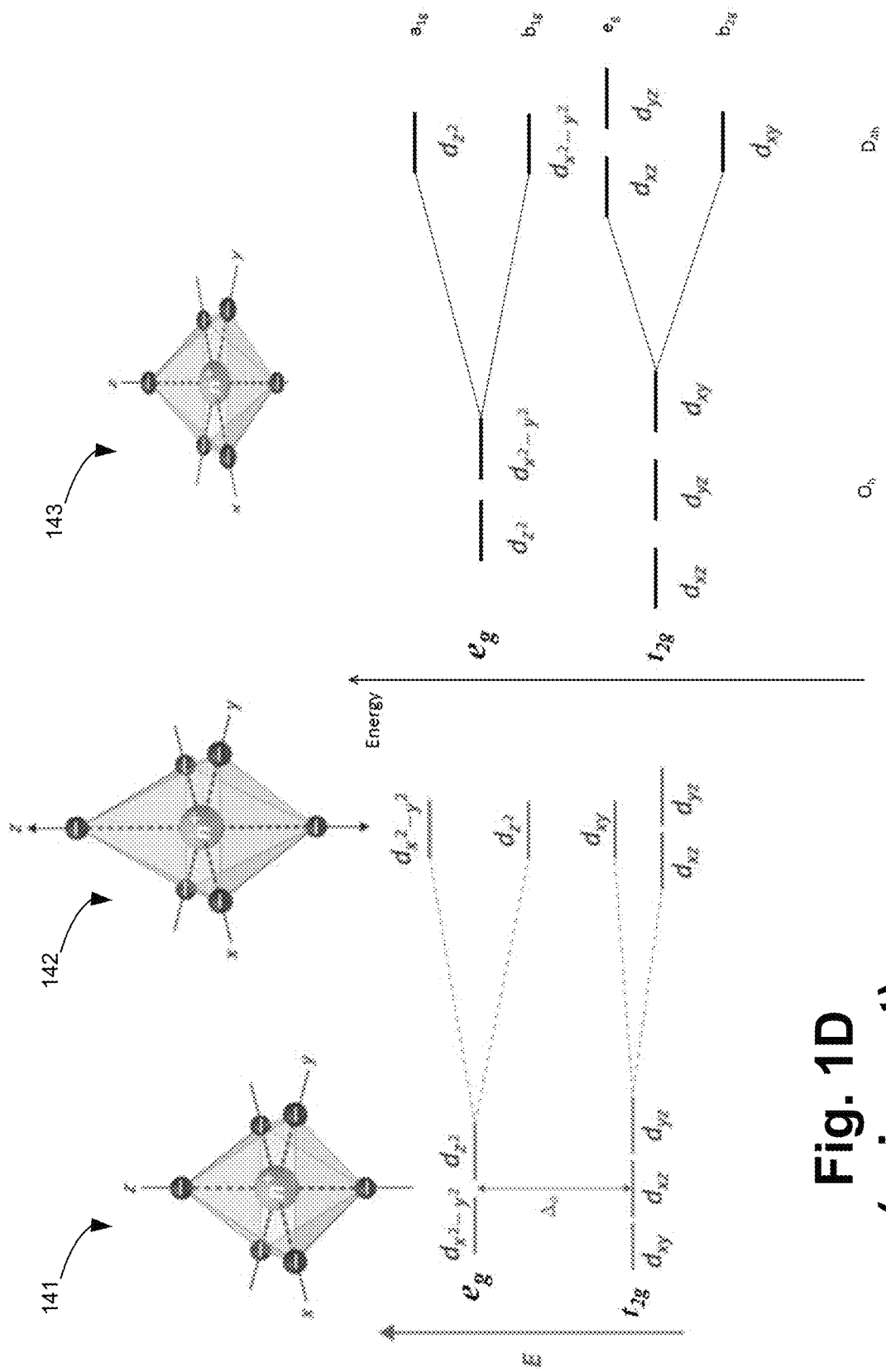
FIG. 1D illustrates an octahedral molecule of N—O bonds with J-T distortion (e.g., elongation and compression) with corresponding energy effects for various orbitals.

FIG. 1D illustrates octahedral molecules 141, 142, and 143 of N—O bonds without and with J-T distortion (e.g., elongation and compression), respectively, with corresponding energy effects for various orbitals. Octahedral molecule 141 is the structure of Ni—O without J-T distortion and with $\Delta_o$ energy separation between $t_{2g}$ and $e_g$ orbitals. Octahedral molecule 142 is the structure of Ni—O with elongation caused by J-T distortion. The elongation along the z-axis lifts the symmetry of the molecular system leading to breaking of the degeneracy. Here, $e_g$ orbital is split into $d_{x^2-y^2}$ and $d_{z^2}$ orbitals while $t_{2g}$ orbital is split into $d_{xy}$ and $d_{xz}$ and $d_{yz}$ orbitals. Since the $d_{x^2-y^2}$ orbital is antibonding, it is expected to increase in energy due to elongation. The $d_{xy}$ orbital is still nonbonding, however, it is destabilized due to the interactions. The elongation of the crystal along the z-axis produces lowered energies for the $d_{xz}$, $d_{yz}$ and $d_{z^2}$ orbitals.

Octahedral molecule 143 is the structure of Ni—O with compression caused by J-T distortion. Here, the degeneracy is broken by the stabilization (e.g., lowering in energy) of the d-orbitals without a z-component, while the orbitals with a z-component are destabilized (e.g., higher in energy) because the z-component d-orbitals have greater overlap with the ligand orbitals, resulting in the orbitals being higher in energy. Since the $d_{z^2}$ orbital is antibonding, it is expected to increase in energy due to compression. The $d_{xz}$ and $d_{yz}$ orbitals are still nonbonding, however, these orbitals are destabilized due to the interactions. The compression of the lattice along the x-axis produces lowering of energy for $d_{xz}$ and $d_{z^2}$ orbitals.

Figure 1E:
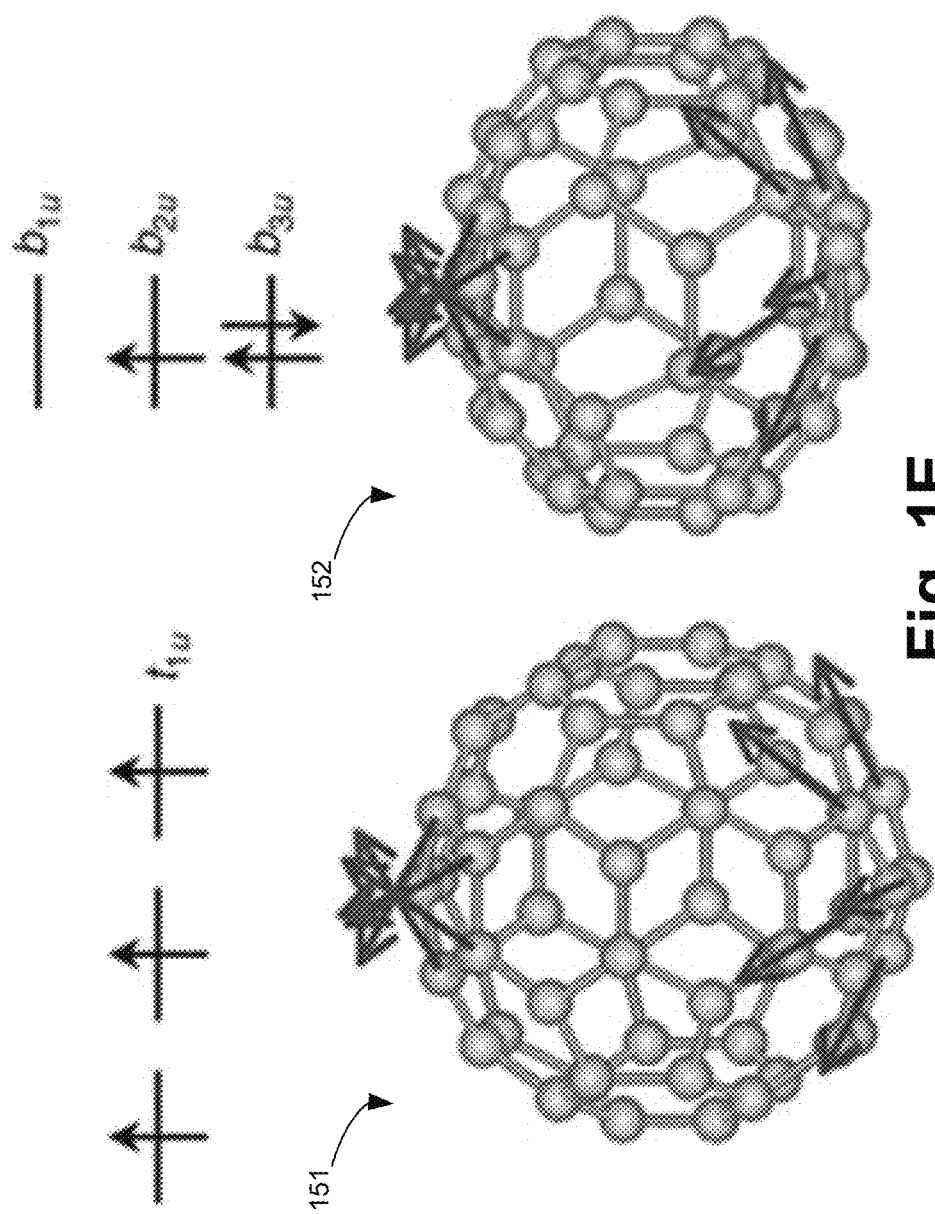
FIG. 1E illustrates J-T distortion in C60 leading to lifting of degeneracy.

FIG. 1E illustrates J-T distortion in $C_{60}$ leading to lifting of degeneracy. When an electron is transferred to $C_{60}$, the bond structure changes leading to lifting of degeneracy. Here, molecular structure 151 is before J-T distortion while molecular structure 152 is after J-distortion in $C_{60}$.

Figure 1F:
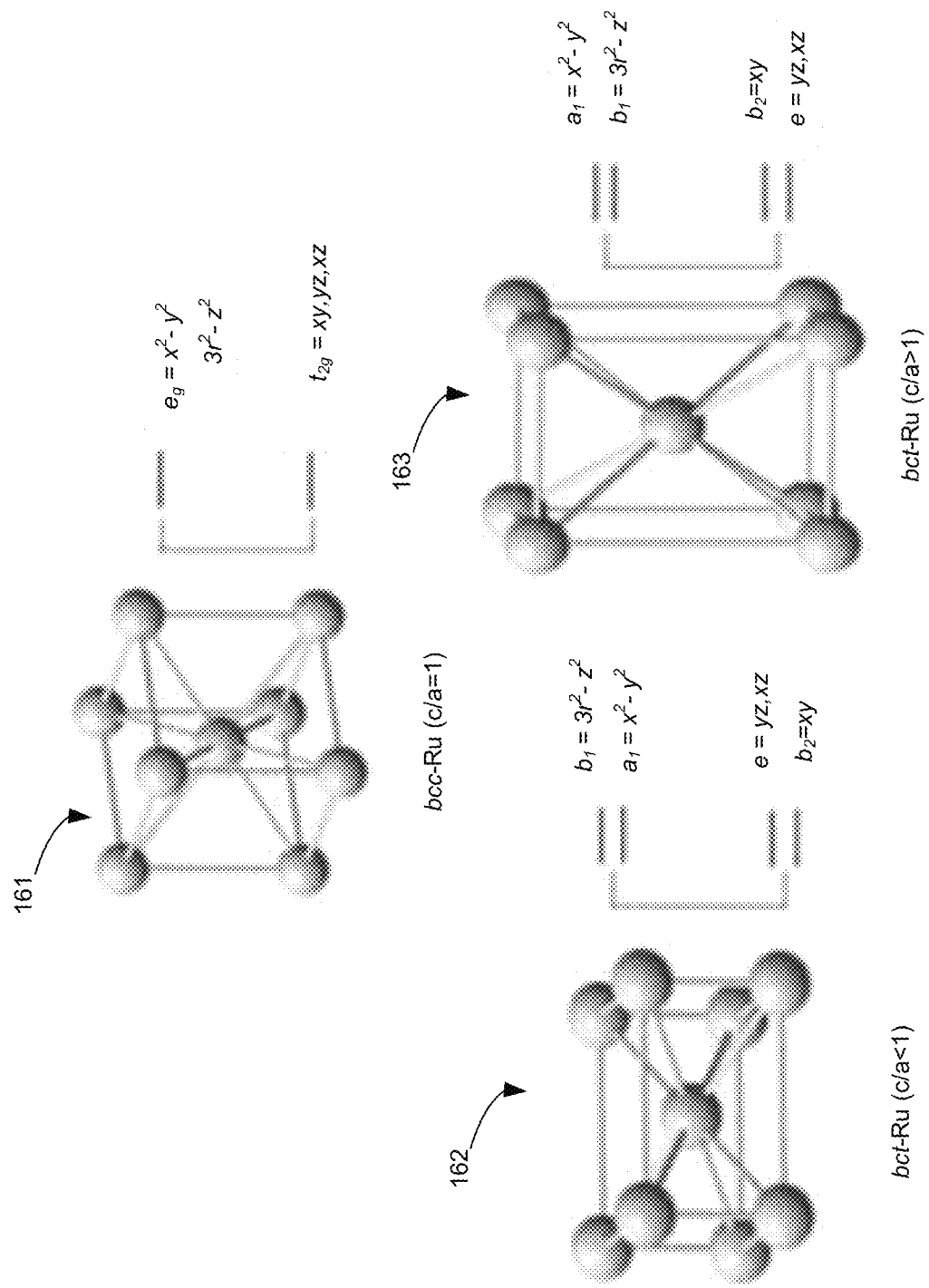
FIG. 1F illustrates J-T distortion (e.g., compressed and elongated) of bcc-Ru.

FIG. 1F illustrates J-T distortion (compressed and elongated) of bcc-Ru (body centered cubic structure of Ruthenium). The outer shells of Ru are $4d^75$ $s^1$. Bcc-Ru 161 (c/a=1) is a lattice structure prior to J-T distortion. Due to J-T compression of bcc-Ru 161, bct-Ru 162 (c/a<1) lattice structure is achieved, where bct is body-centered-tetragonal. Due to J-T elongation of bcc-Ru 161, bct-Ru 163 (c/a>1) lattice structure is realized. Here, bct-Ru 162/163 exhibit large perpendicular magneto-crystalline anisotropy whose energy is two orders of magnitude greater than those of traditional 3d magnetic metals. This increase in energy is because of J-T effect which splits the $e_g$ orbitals. Various embodiments apply J-T effect on Ru to increase magnetic anisotropy $H_k$ and/or lower magnetization $M_s$. However, the embodiments are not limited to Ru, and other metals that exhibit perpendicular magneto-crystalline anisotropy due to J-T effect are within the scope of the disclosure. For example, Nb, W, Ir, and Pt can be used in addition to Ru. Another class of materials are crystals containing ions such as $Mn^{3+}$ or $Cu^{2+}$. For example complex oxides, such as $La_{1-x}Sr_xMnO_3$. In this example, the crystal structure is a perovskite crystal structure where the J-T ion, Mn, is surrounded by 6 oxygen ions.

In the following description, numerous details are discussed to provide a more thorough explanation of the embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIGS. 2A-B illustrate a three-dimensional (3D) view 200 and corresponding cross-section 220, respectively, of a magnetic memory hard-disk drive (HDD) using J-T materials to increase magnetic anisotropy ($H_k$) and/or lower magnetization ($M_s$), according to some embodiments of the disclosure. In some embodiments, HDD comprises a substrate 201 (e.g., glass substrate), a heat spreading layer 202, transition metal layer 203, recording layer 204, and cladding layer 205. In some embodiments, after substrate 201 is formed, heat spreading layer 202 is deposited above substrate 201. In some embodiments, layer 202 is formed of Ru and similar materials. In some embodiments, transition metal layer 203 is formed above heat spreading layer 202. In some embodiments, transition metal layer 203 is formed of strain producing substrates such as BTO (e.g., $Bi_{12}TiO_{20}$ or $Bi_4Ti_3O_{12}$.), $D_ySCO_3$, GaAs, and group III-V substrates.

In some embodiments, transition metal layer 203 is formed of one of: Mo, Pd, Cr, or CoCrPt. In some embodiments, transition metal layer 203 is formed of Mo (110) face centered cubic (FCC) lattice. In some embodiments, magnetic recording layer 204 is grown above transition metal layer 203. The magnetic recording layer 204 is used for reading and writing data by storing data in magnetic elements arranged in an array (e.g., rows and columns of magnetic elements or components). In some embodiments, magnetic recording layer is formed of a material selected from a group consisting of: Ru, Pt, Pd, FeGa, and $Tb_xDy_{1-x}Fe_2$. In some embodiments, cladding layer 205 or lubricant 205 is deposited over magnetic recording layer 204 so that a sensor to read and write to magnetic elements can slide over smoothly. An example of cladding layer 205 or lubricant 205 is a layer of perfluoropolyether (PFPE) which is a chain polymer of fluorine, carbon, and oxygen atoms. In some embodiments, cladding layer 205 or lubricant 205 is a layer of one of: Z-Type Perfluoro Poly Ether Lubricant Polymers, Z-Dol 4000 or Z-Tetroal, ZDol 7800, or Cyclotriphosphazenes.

In some embodiments, magnetic recording layer 204 is formed of bcc-Ru lattice structure prior to J-T distortion. Due to J-T compression caused by Mo of transition metal layer 203, bcc-Ru of recording layer 204 becomes bct-Ru. In some embodiments, Mo is in FCC 110 orientation. Bct-Ru lattice structure exhibits large perpendicular magneto-crystalline anisotropy whose energy is two orders of magnitude greater than those of traditional 3d magnetic metals. This increase in energy is because of J-T effect which splits the $e_g$ orbitals. As such, magnetic anisotropy $H_k$ increases and/or magnetization $M_s$ lowers.

FIGS. 3A-B illustrate two embodiments 300 and 320, respectively, of the magnetic elements in the HDD. It is pointed out that those elements of FIGS. 3A-B having the same reference numbers (or names) as the elements of any other figure can operate or function in any manner similar to that described, but are not limited to such. FIG. 3A illustrates part of the stack of HDD 200/220 where Mo applies J-T effect on Ru magnetic components to increase magnetic anisotropy $H_k$ and lower magnetization $M_s$ of Ru by forming bct-Ru. In this example, cladding layer 205 is formed above magnetic layer 204 as shown in FIGS. 2A-B. FIG. 3B illustrates an embodiment where instead of the cladding layer 205 being in direct contact with magnetic layer 204, another transition metal layer 301 (e.g., Mo) is formed above magnetic layer 204. In some embodiments, the transition metal 203 is to produce a strain induced transition in the transition metal 301. While this embodiment may form a taller HDD, it results in higher magnetic anisotropy $H_k$ than the embodiment of FIG. 3A. In some embodiments, a super-lattice of layers of Ru and Mo is formed between layer 203 and layer 205.

Figure 4:
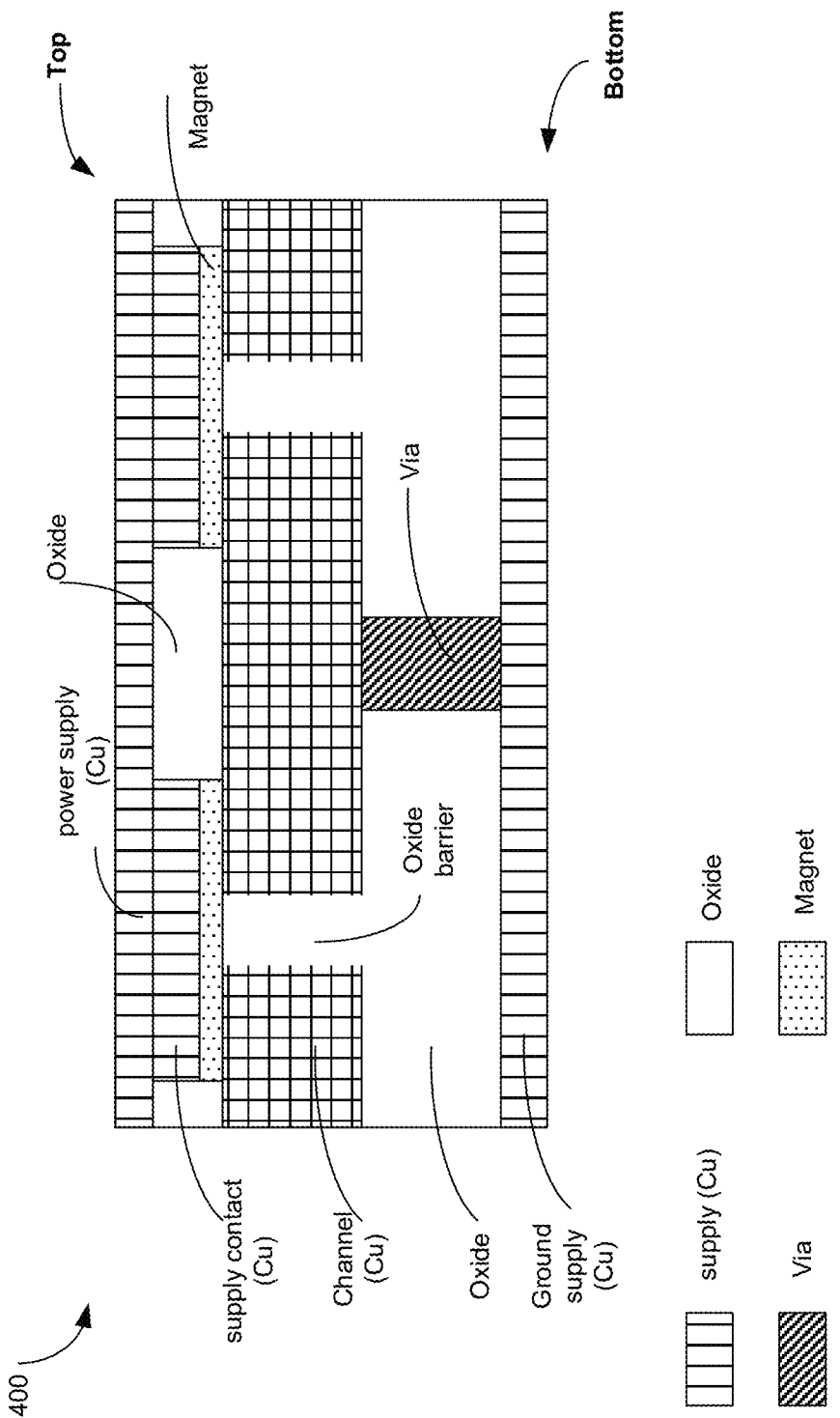
FIG. 4 illustrates a cross-sectional view of a lateral spin logic device.

FIG. 4 illustrates a cross-sectional view 400 of a lateral spin logic device (also referred to as device 400). Here, device 400 is formed with stacking of magnets above a spin channel. To illustrate the deficiencies of device 400, a brief overview of forming device 400 is described. Device 400 is formed by depositing a metal (e.g., Cu) for providing a ground supply and then depositing a layer of oxide over the metal. The metal for the ground supply forms the bottom of device 400. The oxide is then etched to form a via hole which is then filled with metal to form a Via. A metal layer (e.g. layer of Cu) is again deposited to form a Spin Channel. Parts of the Spin Channel are then etched to form barriers between the Spin Channel. Oxide is then deposited into these barriers. Followed by oxide deposition, a magnet layer is deposited and selectively etched to form input and output magnets (e.g., Magnet on the left and Magnet on the right, respectively). These magnets are in direct contact with the Spin Channel. Metal (e.g., Cu) is then deposited on the etched magnets to provide supply contacts followed by a layer of deposition of a metal layer (e.g., layer of Cu) for providing power supply. The metal for power supply forms the top of device 400.

While spin logic and spin memory can enable a new class of logic devices and architectures for beyond Complementary Metal Oxide Semiconductor (CMOS) computing, they suffer from certain deficiencies. For example, existing spin devices such as device 400 suffer from low speed and require high current operation due to magnetic switching speed being limited by the strength of magnetic anisotropy ($H_k$) and low polarization of spin injection from the magnets into the spin channel.

The manufacturing of spin device such as device 400 is expensive. For example, forming the oxide barriers between the Spin Channel is an extra etching step. Furthermore, if the barrier is raised to form a partially thin channel portion above the oxide barrier for coupling the magnets, more complicated processes of etching and deposition are needed. The manufacturing of spin device such as device 400 is also challenging. For example, intermixing of magnetic elements (such as Co, Fe, and Ni) into the Spin Channel produces local spin scattering in the Spin Channel. Spin scattering lowers the performance of device 400 because it lowers the degree of spin polarization of the current injected into the spin channel compared to the current in the ferromagnet. Spin logic devices 500, 600, and 700 of FIGS. 5-7 address some or all of the deficiencies of device 400.

Figure 5:
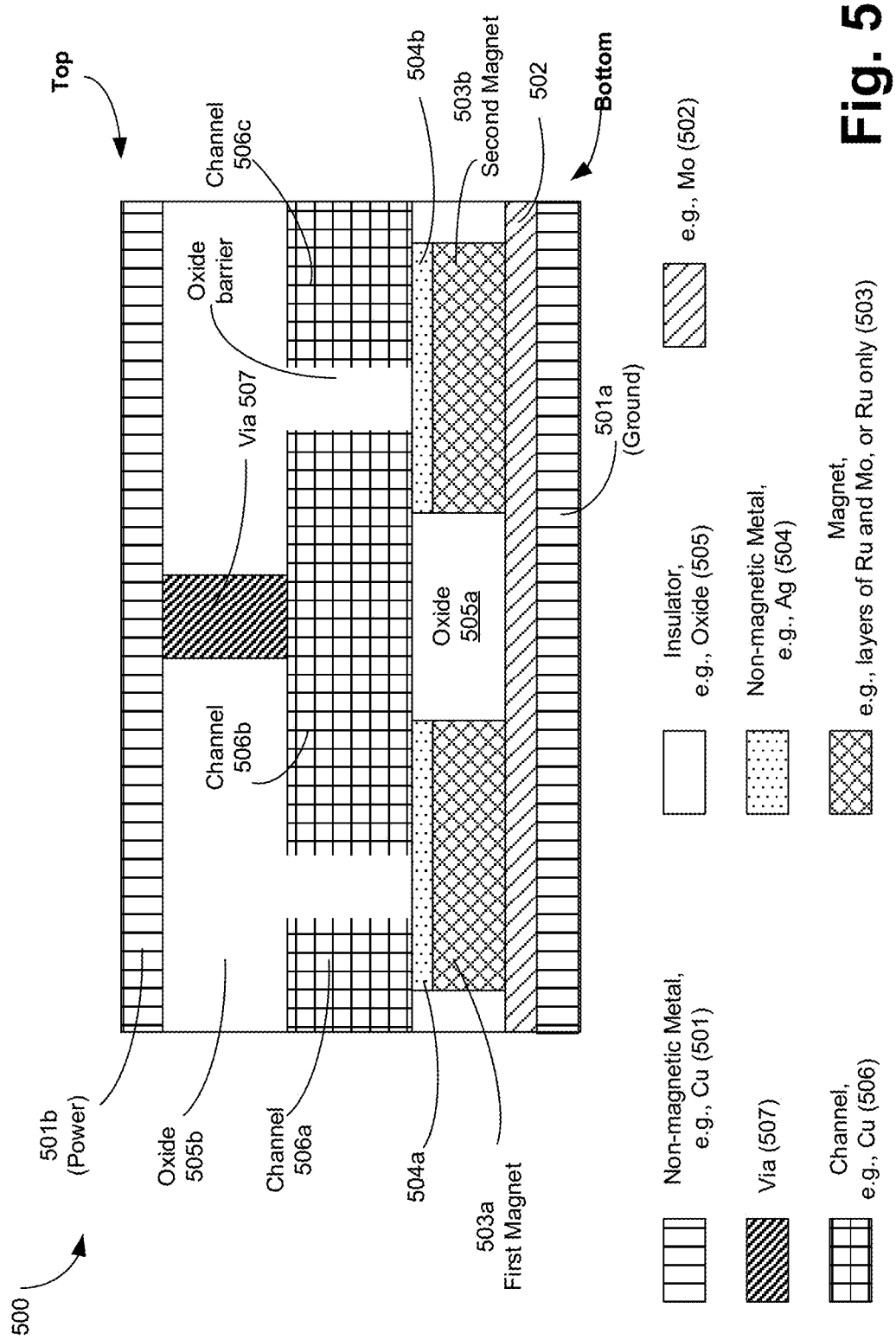
FIG. 5 illustrates a cross-sectional view of an inverted spin logic device having J-T materials for forming its magnets, according to some embodiments of the disclosure.

FIG. 5 illustrates a cross-sectional view 500 of an inverted spin logic device having J-T materials for forming its magnets, according to some embodiments of the disclosure. It is pointed out that those elements of FIG. 5 having the same reference numbers (or names) as the elements of any other figure can operate or function in any manner similar to that described, but are not limited to such.

In some embodiments, device 500 comprises a first metal layer 501a, interface 502 of a transition metal (e.g., Mo), First Magnet 503a formed with bct-J-T materials (e.g., bcc-Ru which later becomes bct-Ru after J-T distortion), Second Magnet 503b also formed with bct-J-T materials (e.g., bcc-Ru which later becomes bct-Ru after J-T distortion), Oxide 505a between First and Second Magnets 503a/b, second interface 504a/b over First and Second Magnets 503a/b respectively, Spin Channel 506 a/b/c, Oxide layer 505b over Spin Channel 506a/b/c, Via 507, and second metal layer 501b. While the various embodiments here are described with reference to bct-J-T materials being bct-Ru and the transition metal being Mo, other materials with similar characteristics may be used.

Here, Ground and Power metal layers 501a and 501b, respectively, may be collectively referred to as metal layers 501; First and Second Magnets 503a and 503b, respectively, may be collectively referred to as magnets 503; interface layers 504a and 504b may be collectively referred to as interface layers 504; Oxide 505a and 505b may be collectively referred to as oxide 505; and Spin Channel 506a/b/c may be collectively referred to as Spin Channel 506.

In some embodiments, the material(s) used for forming metal layers 501, Via 507, and Spin Channel 506 is/are the same. For example, Copper (Cu) can be used for forming metal layers 501, Via 507, and Spin Channel 506. In other embodiments, material(s) used for forming metal layers 501, Via 507, and Spin Channel 506 are different. For example, metal layers 501 may be formed of Cu while Via 507 may be formed of Tungsten (W). Any suitable metal or combination of metals can be used for forming metal layers 501, Via 507, and Spin Channel 506. For example, Spin Channel 506 can be formed of Silver (Ag), Aluminum (Al), Graphene, and other 2D materials.

In some embodiments, First and Second Magnets 503a/b are formed with J-T materials. In some embodiments, First and Second Magnets 503a/b are formed of bcc-Ru lattice structure prior to J-T distortion. Due to J-T compression caused by Mo of transition metal layer 502, bcc-Ru of First and Second Magnets 503a/b becomes bct-Ru. Bct-Ru lattice structure exhibits large perpendicular magneto-crystalline anisotropy whose energy is two orders of magnitude greater than those of traditional 3d magnetic metals. This increase in energy is because of J-T effect which splits the $e_g$ orbitals. As such, magnetic anisotropy $H_k$ increases and magnetization $M_s$ reduces. The transition metal layer 502 of Mo also forms the electrical contact to First and Second Magnets 503a/b. In some embodiments, transition metal layer 502 of Mo provides a template with the right crystal orientation to seed the formation of the bct-Ru alloy. In some embodiments, transition metal layer 502 is one of BTO, STO, $D_y SCO_3$, or materials from group III-V semiconductors.

In some embodiments, First and Second Magnets 503a/b are formed of a stack of J-T materials (e.g., bct-Ru) and Mo. In some embodiments, instead of Mo other materials such as Pt, Pd, Mn, Nb, or Os can be used. For example, multiple layers of bct-Ru and Mo are formed between transition metal layer 502 and templating layers 503a/b. First and Second Magnets 203a/b are also referred to as First and Second Magnet contacts. First Magnet 203a is also referred to as the input magnet while Second Magnet 203b is also referred to as the output magnet. These labels are provided for purposes of describing the various embodiments, but may not change the structure of device 500.

In some embodiments, an engineered interface (i.e., interfaces 504a/b respectively) are formed between the magnets (i.e., First and Second Magnets 503a/b) and Spin Channel 506. For example, an engineered interface between Ag of FCC configuration between bct-Ru and spin channel 506 forms atomistic crystalline matching of the interfaces of the magnet with the channel. The engineered interface provides high mechanical barrier to stop/inhibit the inter-diffusion of the magnetic specifies with Spin Channel 506. The engineered interface also maintains high spin injection at the interface.

In some embodiments, the dimensions (e.g., width, length, and height/thickness) of Ground 501a is chosen to optimize (i.e., reduce) the energy-delay of spin device 500. In some embodiments, interfaces 504a/b are formed of non-magnetic material(s) such that the interface layers and the magnets together have sufficiently matched atomistic crystalline layers. For example, the non-magnetic material has a crystal periodicity which is matched through rotation or by mixing of elements.

Here, sufficiently matched atomistic crystalline layers refer to matching of the lattice constant 'a' within a threshold level above which atoms exhibit dislocation which is harmful to the device (i.e., the number and character of dislocations lead to a significant (e.g., greater than 10%) probability of spin flip while an electron traverses the interface layer). For example, the threshold level is within 5% (e.g., threshold levels in the range of 0% to 5% of the relative difference of the lattice constants). As the matching improves (e.g., matching gets closer to perfect matching), spin injection efficiency from spin transfer from magnets 503 to Spin Channel 506 increases. Poor matching (e.g., matching worse than 5%) implies dislocation of atoms that is harmful for the device. In some embodiments, the non-magnetic material is Ag with a crystal lattice constant a=4.05 A which is matched to bct-Ru provided the direction of the crystal axes is turned by 45 degrees. Then the projection of the lattice constant is expressed as:

$$a\sqrt{2} \approx 5.737 \text{ A}/1.414 \approx 4.057 \text{ A}$$

As such, the magnetic structure stack (e.g., stack of 503a and 504a) allows for interfacial matching of Ru interfaces with the spin channel.

In some embodiments, the directionality of spin logic may be set by the geometric asymmetry in spin device 500. In some embodiments, the area of overlap of First magnet 503a (e.g., the input magnet) with Spin Channel 506b is larger than the area of overlap of Second magnet 503b (e.g., the output magnet) causing asymmetric spin in channel 506b.

One technical effect of the engineered interface layers 504a/b (e.g., Ag) between J-T materials based magnets 503 and Spin Channel 506 is that it provides for higher mechanical barrier to stop or inhibit the inter-diffusion of magnetic species with Spin Channel 506. In some embodiments, the engineered interface layers 504 maintain high spin injection at the interface between Spin Channel 506 and magnets 503. As such, engineered interface layers 504 improve the performance of spin device 500.

In some embodiments, Spin Channel 506 is partitioned into segments 506a, 506b, and 506c such that Oxide 505b forms a barrier between the channel segments. One purpose of the barrier is to control the transfer of spin to charge. In some embodiments, the gap between First and Second Magnets 503a/b, provided by Oxide 505b, is chosen to be sufficient to permit isolation of the two magnets 503. In some embodiments, a layer of oxide 505b is deposited over Spin Channel 506 and then a via hole is etched for Via 507. In some embodiments, Via 507 couples Channel segment 506b to Power supply layer 501b which is formed over Oxide layer 505b.

The embodiment of FIG. 5 is inverted compared to device 400 of FIG. 4. For example, magnetic contacts 503 of device 500 are placed below Spin Channel 506. As such, magnetic contacts 503 are closer to the bottom than the top. Conversely, the magnets of device 400 are closer to the top than the bottom. In some embodiments, the fabrication of J-T materials and the matching layer is via the use of an in situ processing flow. Here, in situ processing flow refers to a fabricating processing flow that does not break vacuum. As such, oxidation on interface 504 are avoided resulting in smooth surfaces at interface 504. The process of fabricating the inverted device 500 allows for templating of J-T materials for an appropriate crystal structure. The process of fabricating device 500 also allows for easier formation of oxide insulation/barrier between the spin channels belonging to separate spin devices.

Figure 6:
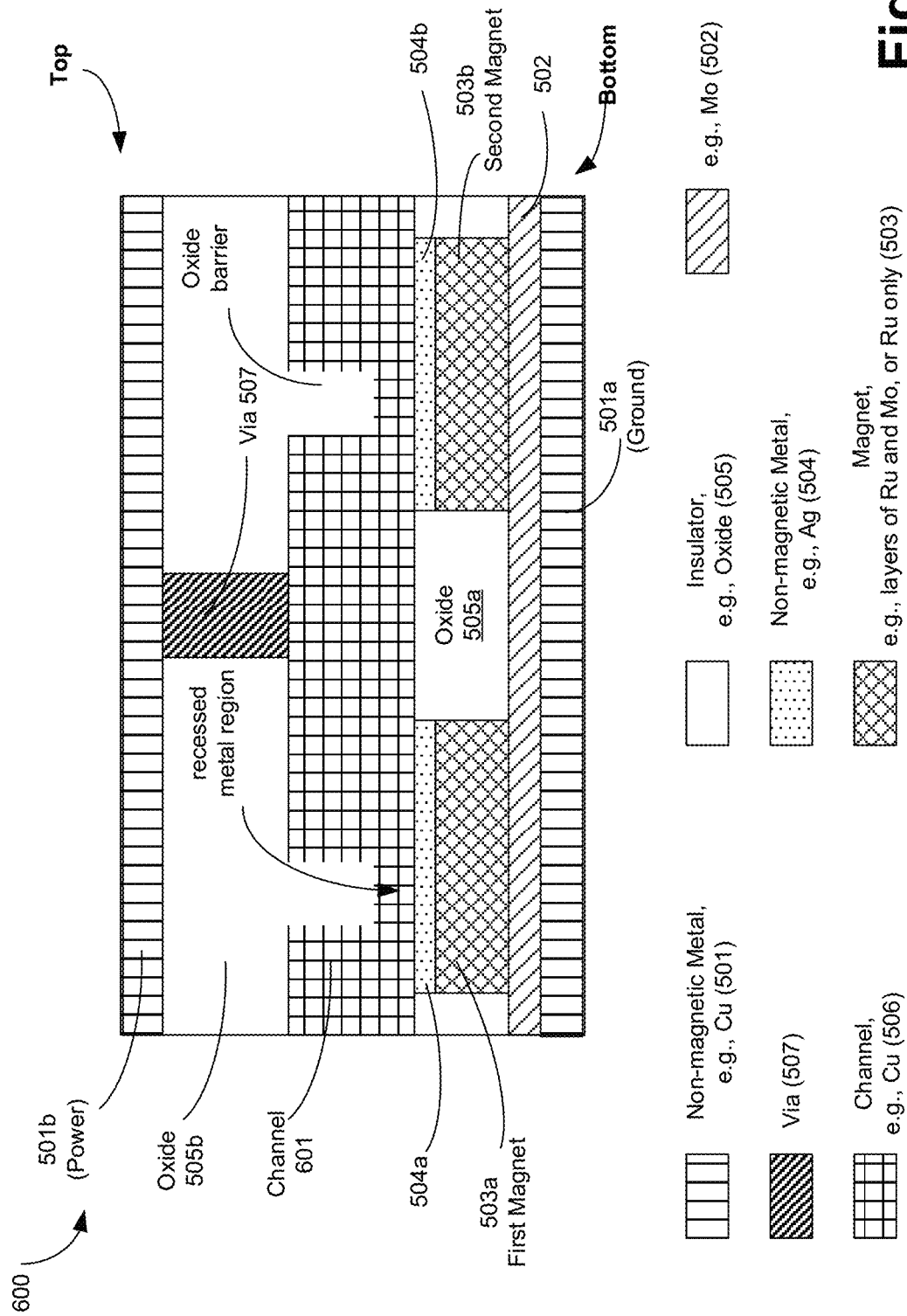
FIG. 6 illustrates a cross-sectional view of an inverted spin logic device with recessed spin channel and having J-T materials for forming its magnets, according to some embodiments of the disclosure.

FIG. 6 illustrates a cross-sectional view 600 of an inverted spin logic device (also referred to as device 600) with recessed spin channel and having J-T materials for forming its magnets, according to some embodiments of the disclosure. It is pointed out that those elements of FIG. 6 having the same reference numbers (or names) as the elements of any other figure can operate or function in any manner similar to that described, but are not limited to such. So as not to obscure the embodiments, differences between spin logic devices of FIG. 6 and FIG. 5 are described.

FIG. 6 is similar to FIG. 5 except that Oxide barriers 505b are not complete barriers between segments of Spin Channel 506. As such, Spin Channel 601 has sections of metal below Oxide barriers 505b for coupling the channel segments. One reason for having recessed metal region under Oxide barriers 505b is to control the rate of exchange of spin between channel segments. In some embodiments, the height or thickness of the recessed metal region controls the rate of exchange of spin. For example, the thicker the recessed metal region (e.g., lesser the metal recession) the higher the rate of exchange of spin. The embodiment of FIG. 3 provides an alternative way of connecting spin devices. In some embodiments, spin logic devices 500/600 are integrated to form majority gate spin logic devices. In some embodiments, input Magnet 503a dictates the flow of the spin current in channel 506b. This is realized by the asymmetry of First 4-State Magnet 503a overlap with channel 506b. Here, input Magnet 503a overlaps more with channel 506b than output Magnet 503b. This asymmetry in the overlap sets the direction of spin through channel 506b, in accordance with some embodiments.

In some embodiments, device 500/600 is configured to operate as a buffer. In some embodiments, when a negative voltage (e.g., −Vdd) is applied to metal layer 501a and ground is applied to metal layer 501b, then device 500/600 behaves as a buffer. In this configuration, when spins are injected in +x direction on channel 506a they are received as spins in +x direction in channel 506c. In some embodiments, when metal layer 501b is tied to positive supply (e.g., +Vdd), and metal layer 501a is tied to ground (e.g., Vss), spin logic device 500/600 behaves as an inverter. In this mode, when spins are injected in +x direction on channel 506a they are received as spins in −x direction in channel 506c.

Figure 7:
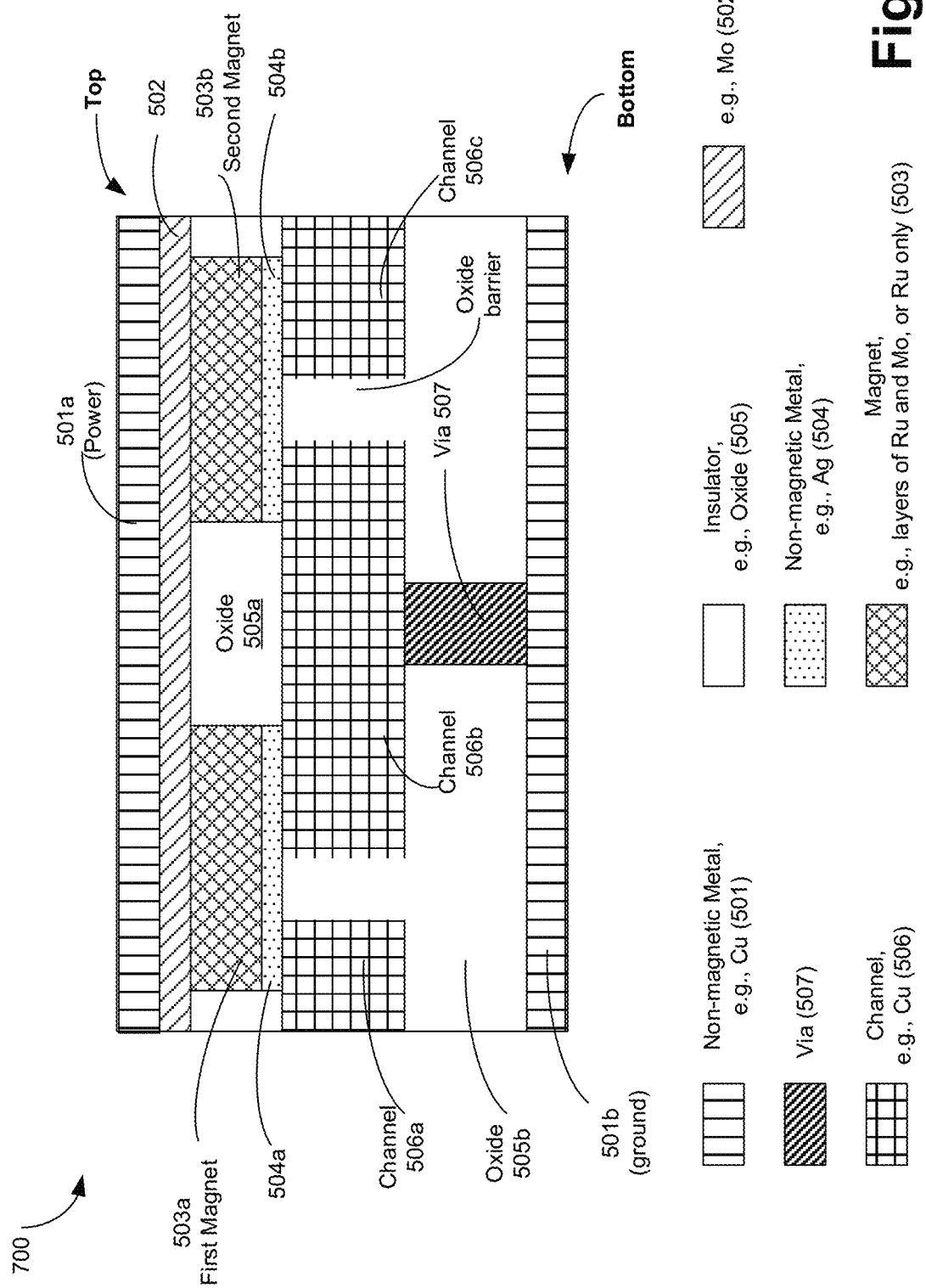
FIG. 7 illustrates a cross-sectional view of a spin logic device having J-T materials for forming its magnets, according to some embodiments of the disclosure.

FIG. 7 illustrates a cross-sectional view 700 of a spin logic device (also referred to as device 700) having J-T materials for forming its magnets, according to some embodiments of the disclosure. It is pointed out that those elements of FIG. 7 having the same reference numbers (or names) as the elements of any other figure can operate or function in any manner similar to that described, but are not limited to such. So as not to obscure the embodiments, differences between spin logic devices of FIG. 7 and FIG. 5 are described. FIG. 7 is similar to FIG. 5 except that the device is flipped or inverted such that the top section of device 500 now becomes the bottom section of device 700, and the bottom section of device 500 becomes the top section of device 700.

Figure 8:
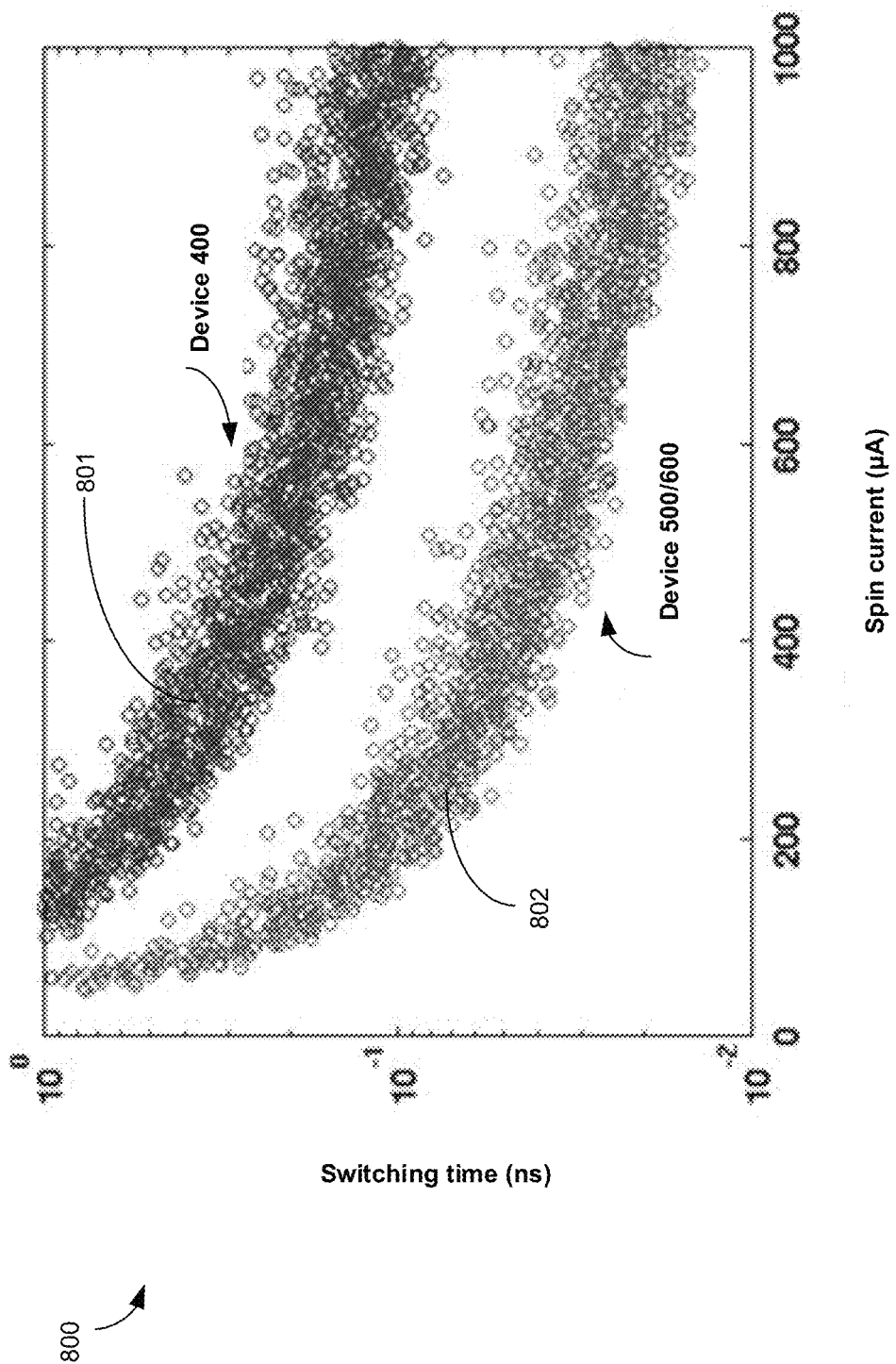
FIG. 8 illustrates a plot showing spin torque switching time improvement with a stack in a spin logic device formed of J-T materials compared to a stack with perpendicular magnet anisotropy, according to some embodiments of the disclosure.

FIG. 8 illustrates plot 800 showing spin torque switching time improvement with a stack in a spin logic device formed of J-T materials compared to a stack with perpendicular magnet anisotropy, according to some embodiments of the disclosure. It is pointed out that those elements of FIG. 8 having the same reference numbers (or names) as the elements of any other figure can operate or function in any manner similar to that described, but are not limited to such. Here, x-axis is spin current in micro-amperes (µA) and y-axis is switching time in nanoseconds (ns).

Plot 800 shows two types of data—801 and 802. Data 801 is for traditional magnetic stack made from perpendicular magnet anisotropy (PMA) while data 802 is for an in-plane magnet using J-T materials and the engineered interface for atomic crystalline matching. Here, magnetic stack 503 has higher $H_k$ (e.g., 10 kOe for data 802 compared to 1 kOe for magnet of FIG. 4) and reduced magnetic anisotropy (e.g., less than 200 kA/m compared to $10^6$ MA/m for CoFe used in PMA). Plot 800 illustrates that the performance of magnetic stack 503 with J-T materials provides faster switching or switching with smaller current compared to traditional magnetic stack of FIG. 4 (using traditional magnets) according to some embodiments.

Figure 9:
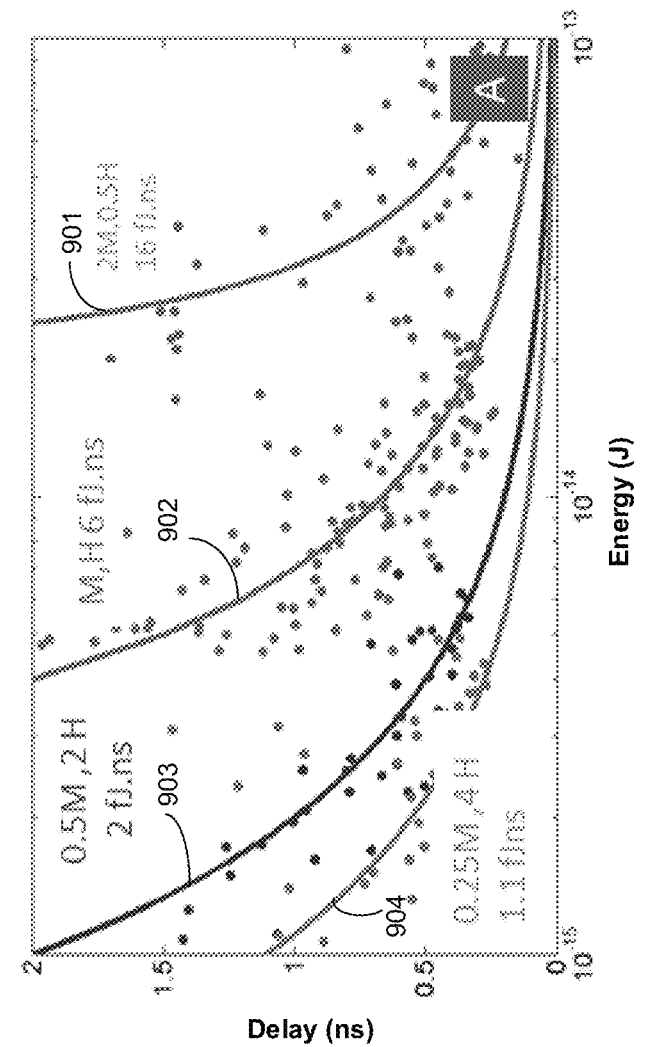
FIG. 9 illustrates a plot showing the effects high $H_k$ and low $M_s$ J-T materials on energy and delay of a spin logic device, according to some embodiments of the disclosure.

FIG. 9 illustrates plot 900 showing the effects high $H_k$ and low $M_s$ J-T materials on energy and delay of a spin logic device, according to some embodiments of the disclosure. It is pointed out that those elements of FIG. 9 having the same reference numbers (or names) as the elements of any other figure can operate or function in any manner similar to that described, but are not limited to such.

Four cases are shown labeled as 901, 902, 903, and 904. For each case, the product of $M_s$ and $H_k$ is kept constant to keep the energy barrier at a certain value to guard against thermal fluctuations. Case 901 uses $2M_s$ and $0.5H_k$ and requires higher energy than other cases for the same delay.

For case 901, the energy-delay product is 16 fJ.ns. Case 902 uses 1M$_s$ and 1H$_k$ with energy-delay product of 6 fJ.ns. Case 903 uses 0.5M$_s$ and 2H$_k$ with energy-delay product of 2 fJ.ns. Case 904 uses 0.25M$_s$ and 4H$_k$ with energy-delay product of 1.1 fJ.ns. Plot 900 shows the effects of lower M$_s$ and higher H$_k$ on the energy-delay product. In some embodiments, the energy-delay product improves (i.e., reduces) using higher H$_k$ and lower M$_s$ as with J-T materials (e.g., bct-Ru).

Figure 10:
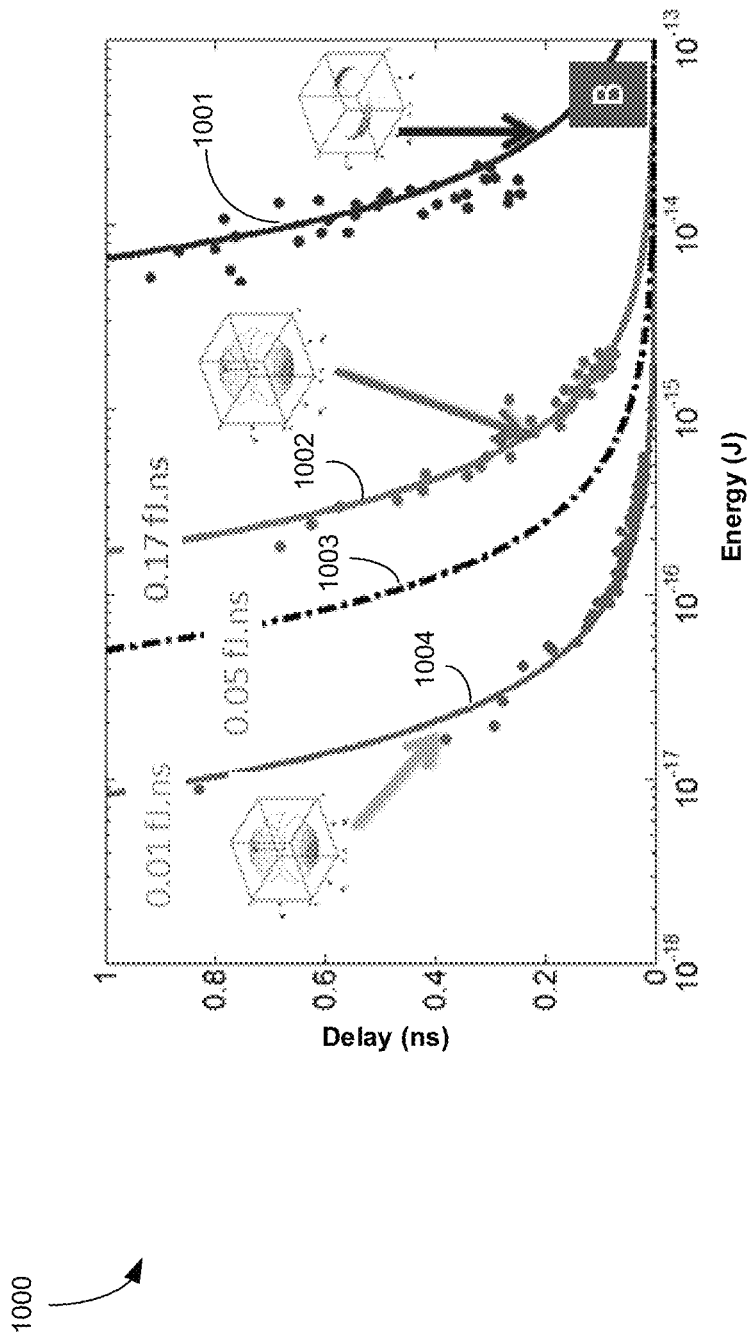
FIG. 10 illustrates a plot comparing the energy-delay relationship for different types of devices including a device using J-T materials for its spin logic device, according to some embodiments of the disclosure.

FIG. 10 illustrates plot 1000 comparing the energy-delay relationship for different types of devices including a device using J-T materials for its spin logic device, according to some embodiments of the disclosure. It is pointed out that those elements of FIG. 10 having the same reference numbers (or names) as the elements of any other figure can operate or function in any manner similar to that described, but are not limited to such. Here, x-axis is Energy (in Joules J) and y-axis is Delay (in ns).

Four cases are shown labeled as 1001, 1002, 1003, and 1004. Case 1001 is an energy-delay curve for an in-plane ferromagnet. Case 1002 is an energy-delay curve for a PMA ferromagnet. Case 1003 is an energy-delay curve for a 20 nm sub-threshold low-power CMOS device. Case 1004 is an energy-delay curve for ferromagnets using higher H$_k$ and lower M$_s$ as with J-T materials, according to some embodiments.

Table 1 shows the performance of spin logic device 200/300 against traditional spin logic devices made from in-plane and PMA magnets.

TABLE 1

Energy-delay comparison

|  |  | In-plane | PMA | J-T materials PMA spin device 500 |
|---|---|---|---|---|
| Energy-delay | aJ · ns | 6400 | 170 | 10 |
| M$_s$ | A/m | $10^6$ | $10^6$ | $250 \times 10^3$ |
| H$_k$ | A/m | $3 \times 10^4$ | $4 \times 10^4$ | $16 \times 10^4$ |

The four cases of plot 1000 and Table 1 illustrate that the energy-delay curves for ferromagnets using higher H$_k$ and lower M$_s$, as with J-T materials, is far better (i.e., smaller) than energy-delay curves for other cases.

The improvement in energy-delay product (i.e., lower energy and delay) is because of the improved nanomagnets dynamics. The transient spin dynamics and transport of lateral spin logic device 500 can be simulated using vector spin circuit models coupled with nanomagnets dynamics. As such, the operation of spin logic device 500/600 can be verified using multi-physics simulation which treats the nanomagnets as single magnetic moments and uses spin circuit theory to calculate the scalar voltage and vector spin voltages.

The dynamics of nanomagnets can be described by Landau-Lifshitz-Gilbert equations:

$$\frac{\partial m_1}{\partial t} = -\gamma \mu_0 [m_1 \times \overline{H}_{\mathit{eff}}] + \alpha \left[ m_1 \times \frac{\partial m_1}{\partial t} \right] - \frac{\overline{I}_{s1}}{eN_s}$$

$$\frac{\partial m_2}{\partial t} = -\gamma \mu_0 [m_2 \times \overline{H}_{\mathit{eff}}] + \alpha \left[ m_2 \times \frac{\partial m_2}{\partial t} \right] - \frac{\overline{I}_{s2}}{eN_s}$$

Here, $\overline{I}_{s1}$ and $\overline{I}_{s2}$ are the projections perpendicular to magnetizations of the spin polarized currents entering the two free nanomagnets—First and Second Free Magnet layers 503a/b, respectively. These projections are derived from the spin-circuit analysis. The effective magnetic field $\overline{H}_{\mathit{eff}}$ originating from shape and material anisotropy, and the Gilbert damping constant 'α' are the properties of the magnets. The spin currents are obtained from a vector transport model for the magnetic stack. Here, m$_1$ and m$_2$ are magnetization vectors of the First and Second Free Magnet layers 503a/b, respectively, N$_s$ is the number of spins in each of First and Second Free Magnet layers 503a/b. In some embodiments, the spin equivalent circuit comprises a tensor spin conduction matrix governed by the present conduction of the magnet. In one embodiment, a self-consistent stochastic solver is used to account for thermal noise of the magnets.

Figure 11:
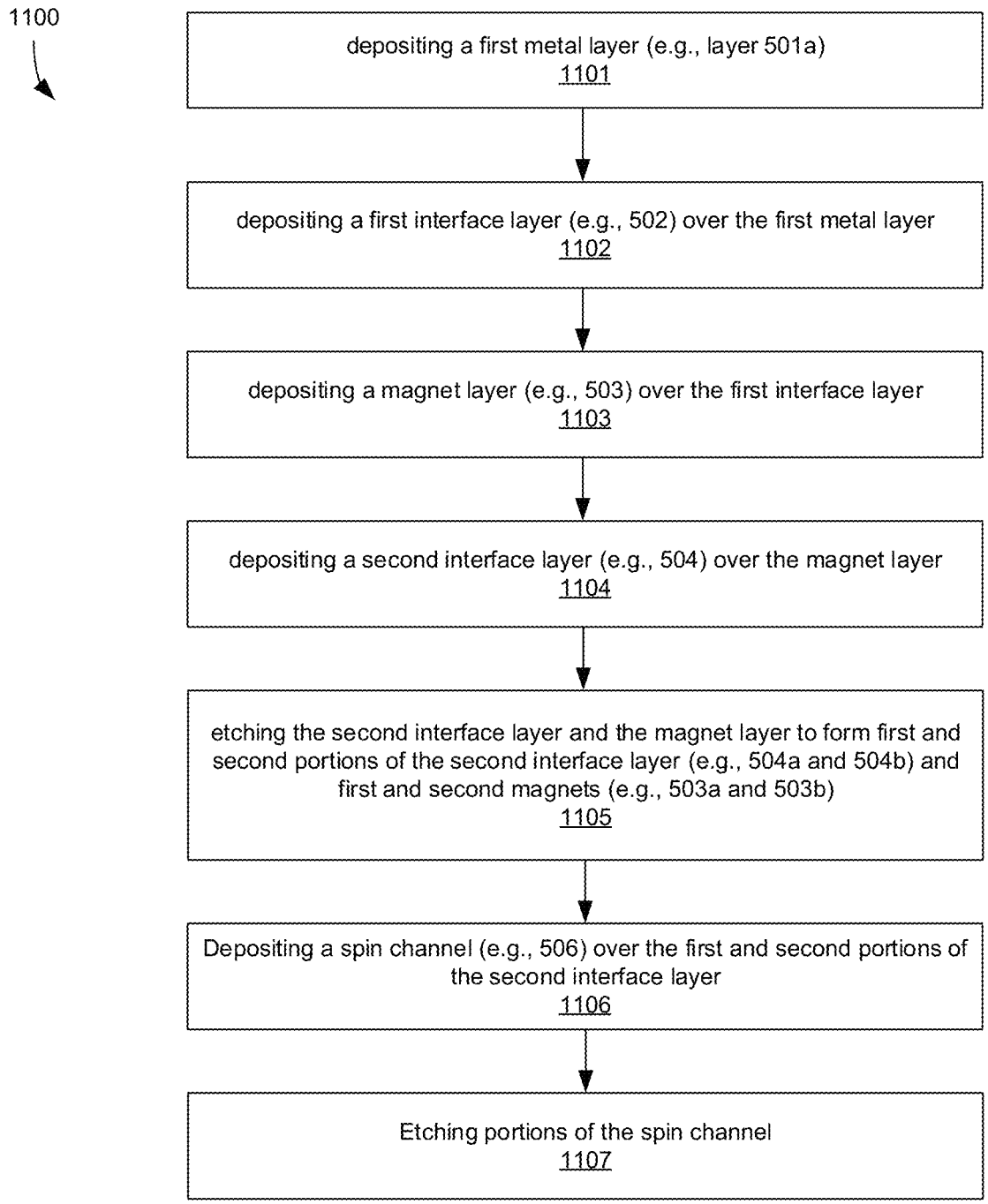
FIG. 11 illustrates a flowchart of a method for fabricating a spin logic device with stacking of magnets formed of J-T materials below a spin channel and with matched spacer for improved spin injection, according to some embodiments of the disclosure.

FIG. 11 illustrates a flowchart of a method for fabricating a spin logic device with stacking of magnets formed of J-T materials below a spin channel and with matched spacer for improved spin injection, according to some embodiments of the disclosure. It is pointed out that those elements of FIG. 11 having the same reference numbers (or names) as the elements of any other figure can operate or function in any manner similar to that described, but are not limited to such.

Although the blocks in the flowchart with reference to FIG. 11 are shown in a particular order, the order of the actions can be modified. Thus, the illustrated embodiments can be performed in a different order, and some actions/blocks may be performed in parallel. Some of the blocks and/or operations listed in FIG. 11 are optional in accordance with certain embodiments. The numbering of the blocks presented is for the sake of clarity and is not intended to prescribe an order of operations in which the various blocks must occur. Additionally, operations from the various flows may be utilized in a variety of combinations.

At block 1101, first metal layer 501a is deposited. In some embodiments, first metal layer 501a is coupled to ground to provide ground supply to device 200. At block 1102, interface layer 502 is deposited over first metal layer 501a. In some embodiments, interface layer 502 is formed of a transition metal (e.g., Mo). At block 1103, a magnet layer 503 (before being etched to form input and output magnets 503a/b) is deposited over first interface layer 502. In some embodiments, magnet layer 503 is formed of a J-T material (e.g., bct-Ru). In some embodiments, a stack of Ru and Mo layers are used to form magnet layer 503.

At block 1104, a second interface layer 504 (before being etched to form first and second interface layers 504a/b) is deposited over magnet layer 503 such that magnet layer 503 is sandwiched between the first and second interface layers 502 and 504. In some embodiments, interface layers 504 are formed of non-magnetic material such that the interface layers and magnet layers 503 together have sufficiently matched atomistic crystalline layers.

In some embodiments, the processes of blocks 1101, 1102, 1103, and 1104 are performed in situ (i.e., the fabrication processes do not break vacuum). As such oxidization between interfaces of the layers 501, 502, 503, and 504 is avoided (i.e., smooth interface surfaces are achieved). Smooth interface surfaces of the layers 501, 502, 503, and 504 allow for higher spin injection efficiency, according to some embodiments.

In some embodiments, magnet layer 503 is patterned to form First and Second Magnets 503a and 503b. This process breaks vacuum. For example, a photo-resist material is deposited over second interface layer 504 and then etched for forming a patterned photo-resist layer, where the pattern indicates future locations of First and Second Magnets 503a/b. At block 1105, second interface layer 504 and magnet layer 503 are selectively etched using the patterned photo-resist to form first and second portions 503a/b of magnet layer 503. As such, First and Second Magnets 503a/b are also formed. In some embodiments, the etching stops above interface layer 502. The photo-resist material is then removed.

At block 1106, Spin Channel 506 (e.g., metal layer) is deposited over first and second portions 504a/b of interface layer 504. In some embodiments, Spin Channel 506 is patterned into segments 506a/b/c by photo-resist deposition and patterning of the photo-resist material. At block 1107, portions of Spin Channel 506 are etched to form segments of Spin Channel 506/a/b/c. Depending on whether device 500 or device 600 is being formed, the depth of etching of Spin Channel 506 is adjusted. In some embodiments, the method further comprises filing the etched portions with an insulator (e.g., Oxide 505b). In some embodiments, Oxide 505b is etched to form a via hole which is then filled with a metal to form Via 507 such that it couples Spin Channel 506b at one end of Via 507. In some embodiments, a second metal layer 501b is deposited over Oxide 506b to make contact with the other end of Via 507. In some embodiments, second metal layer 501b is coupled to a Power supply.

Figure 12A:
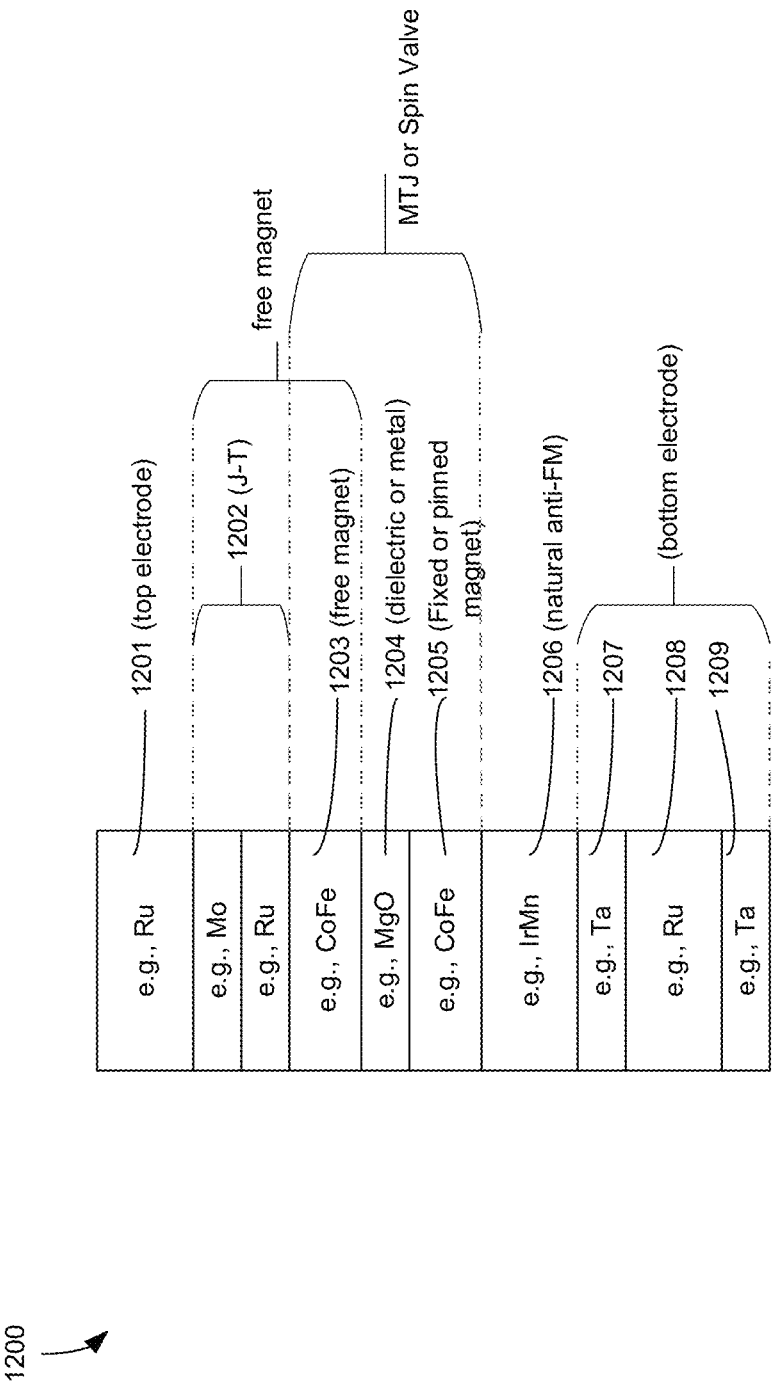
FIG. 12A illustrates a magnetic junction device having J-T materials adjacent to the free magnet of the magnetic junction, according to some embodiments of the disclosure.

FIG. 12A illustrates a magnetic junction device 1200 having J-T materials adjacent to the free magnet of the magnetic junction, according to some embodiments of the disclosure. In some embodiments, magnetic junction device 1200 comprises a top electrode 1201 (e.g., Ru), J-T materials 1202 (e.g., layers of Mo and Ru, where layer of Mo is coupled to top electrode 1201 while layer of Ru is coupled to a free magnet), free magnet 1203 (e.g., CoFe), dielectric or metal layer 1204, fixed or pinned magnet 1205 (CoFe), a layer of anti-ferromagnet (e.g., IrMn), and a bottom electrode having layers 1207 (e.g., Ta), 1208 (e.g., Ru), and 1209 (e.g., Ta).

In some embodiments, the magnetization direction of the fixed magnetic layer 1205 is parallel or anti-parallel relative to the direction of magnetization of free magnet 1203. For example, the magnetization direction of the free magnetic layer 1203 is in-plane while the magnetization direction of the fixed magnetic layer is also in-plane. In some embodiments, the magnetization direction of the fixed magnetic layer 1205 is perpendicular relative to the magnetization direction of the free magnetic layer 1203 (i.e., magnetization directions of the free and fixed magnetic layers are not parallel, rather they are orthogonal). For example, the magnetization direction of the fixed magnetic layer 1205 is in-plane while the magnetization direction of the free magnetic layer 1203 is perpendicular to the in-plane. In another example, the magnetization direction of the free magnetic layer 1203 is in-plane while the magnetization direction of the fixed magnetic layer 1205 is perpendicular to the in-plane. The thickness of a ferromagnetic layer (i.e., fixed or free magnetic layer) may determine its magnetization direction.

For example, when the thickness of the ferromagnetic layer is above a certain threshold (depending on the material of the magnet, e.g. approximately 1.5 nm for CoFe), then the ferromagnetic layer exhibits magnetization direction which is in-plane. Likewise, when the thickness of the ferromagnetic layer is below a certain threshold (depending on the material of the magnet), then the ferromagnetic layer exhibits magnetization direction which is perpendicular to the plane of the magnetic layer. Other factors may also determine the direction of magnetization.

For example, factors such as surface anisotropy (depending on the adjacent layers or a multi-layer composition of the ferromagnetic layer) and/or crystalline anisotropy (depending on stress and the crystal lattice structure modification such as FCC, BCC, or L10-type of crystals, where L10 is a type of crystal class which exhibits perpendicular magnetizations), can also determine the direction of magnetization.

In some embodiments, the free magnetic layer 1203 is coupled to J-T materials 1202. As such, a new free magnet is formed comprising layers 1203 and section 1202, in accordance with some embodiments. Here, J-T material is bct-Ru which is distorted version of bcc-Ru by layer of Mo. Here, Mo is formed with FCC 110 orientation. In some embodiments, Mo of 1202 functions to provide tetragonal distortion to bcc-Ru to form bct-Ru of 1202. In some embodiments, Mo of 1202 also provides exchange coupling through RKKY (Ruderman-Kittle-Kasuya-Yosida). In some embodiments, free magnet 1203 is replaced with segment 1202. In some embodiments, the free magnet is formed by layer 1203 and segment 1202 having J-T material.

In some embodiments, free magnet 1203 is made from CFGG (i.e., Cobalt (Co), Iron (Fe), Germanium (Ge), or Gallium (Ga) or a combination of them). In some embodiments, the free magnet is formed from Heusler alloys. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the free magnet is a Heusler alloy lattice matched to Ag (i.e., the Heusler alloy is engineered to have a lattice constant close (e.g., within 3%) to that of Ag). In some embodiments, the free magnetic layer is formed of Heusler alloy, Co, Fe, Ni, Gd, B, Ge, Ga, or a combination of them.

In some embodiments, Heusler alloys that form input and/or output magnets 202 and 203, respectively, are one of: $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Co_2FeAl$, $Fe_2VAl$, $Mn_2VGa$, $Co_2FeGe$, MnGa, or MnGaRu.

In some embodiments, a magnet with perpendicular magnetic anisotropy (PMA) is formed form multiple layers in a stack (e.g., perpendicular magnetic layer is formed of multiple layers) for magnets 1203 and/or 1205. The multiple thin layers can be layers of Cobalt and Platinum (i.e., Co/Pt), for example. Other examples of the multiple thin layers include: Co and Pd; Co and Ni; MgO, CoFeB, Ta, CoFeB, and MgO; MgO, CoFeB, W, CoFeB, and MgO; MgO, CoFeB, V, CoFeB, and MgO; MgO, CoFeB, Mo, CoFeB, MgO; $Mn_xGa_y$; Materials with L10 crystal symmetry; or materials with tetragonal crystal structure. In some embodiments, the perpendicular magnetic layer is formed of a single layer of one or more materials. In some embodiments, the single layer is formed of MnGa. In some embodiments, the perpendicular magnetic layer is formed of one of: a Heusler alloy, Co, Fe, Ni, Gd, B, Ge, Ga, or a combination of them. A wide combination of materials can be used for material stacking of magnetic junction 1200. For example, the stack of materials include: $Co_xFe_yB_z$, MgO, $Co_xFe_yB_z$, Ru, $Co_xFe_yB_z$, IrMn, Ru, Ta, and Ru, where 'x,' 'y,' and 'z' are fractions of elements in the alloys. Other materials may also be used to form magnetic junction device 1200.

In some embodiments, when layer 1204 is a metal, then magnetic junction 1200 is a spin valve. In some embodiments, when layer 1204 is a dielectric (e.g., MgO) then magnetic junction 1200 is a magnetic tunneling junction (MTJ). MTJ can be used to form magnetic memories. MTJ is a magnetic element that is comprised of two magnetic layers separated by a thin insulating layer. One of the magnetic layers is called the reference layer (RL) or the pinned magnetic layer, and it provides a stable reference magnetic orientation. The bit is stored in the second magnetic layer which is called the free layer (FL), and the orientation of the magnetic moment of the free layer can be either in one of two states—parallel to the reference layer or anti-parallel to the reference layer.

Because of the tunneling magneto-resistance (TMR) effect, the electrical resistance of the anti-parallel state is significantly higher compared to the parallel state. To write information in a STT-MRAM device, the spin transfer torque effect is used to switch the free layer from the parallel to anti-parallel state and vice versa. The passing of current through the MTJ produces spin polarized current, which results in a torque being applied to the magnetization of the free layer. When the spin polarized current is sufficiently strong, enough torque is applied to the free layer to cause its magnetic orientation to change, thus allowing for bits to be written.

To read the stored bit, the sensing circuitry measures the resistance of the MTJ. Since the sensing circuitry needs to determine whether the MTJ is in the low resistance (e.g. parallel) state or in the high resistance state (e.g. anti-parallel) with acceptable signal-to-noise, the STT-MRAM cell needs to be designed such that the overall electrical resistance and resistance variation of the cell are minimized and the capacitance of the cell is of secondary importance.

Figure 12B:
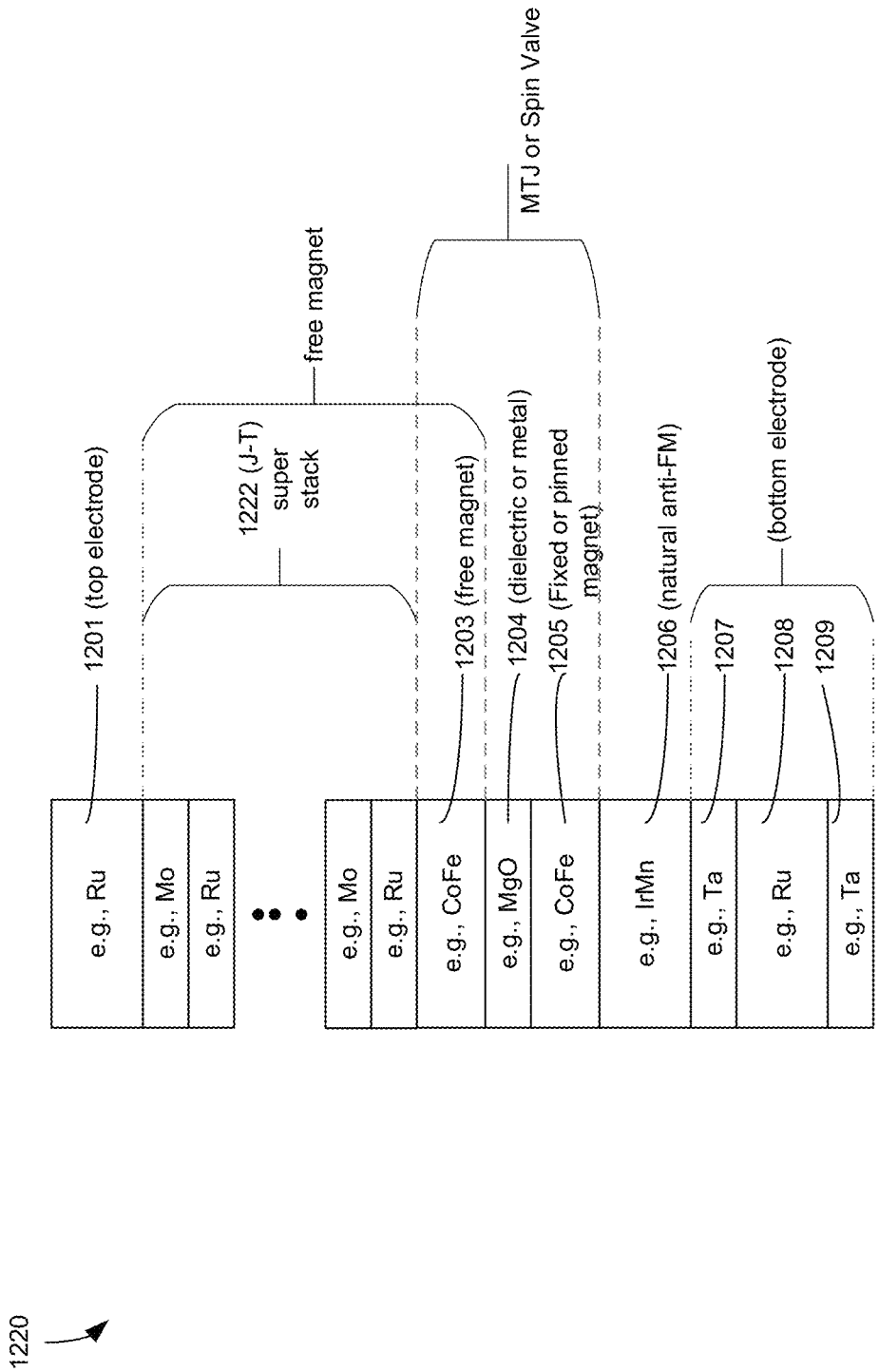
FIG. 12B illustrates a magnetic junction device having a super lattice stack of J-T materials adjacent to the free magnet of the magnetic junction, according to some embodiments of the disclosure.

FIG. 12B illustrates magnetic junction device 1220 having a super lattice stack of J-T materials adjacent to the free magnet of the magnetic junction, according to some embodiments of the disclosure. It is pointed out that those elements of FIG. 12B having the same reference numbers (or names) as the elements of any other figure can operate or function in any manner similar to that described, but are not limited to such. So as not to obscure the embodiments, differences between FIG. 12A and FIG. 12B are described. In some embodiments, section 1202 of FIG. 12A can be replaced with a super-lattice stack of J-T materials 1222 (e.g., stack of Mo and bct-Ru). In some embodiments, super-lattice stack 1222 replaces free magnet 1203. In some embodiments, the free magnet is formed by layer 1203 and section 1222 having super-lattice stack of J-T materials.

Figure 13A:
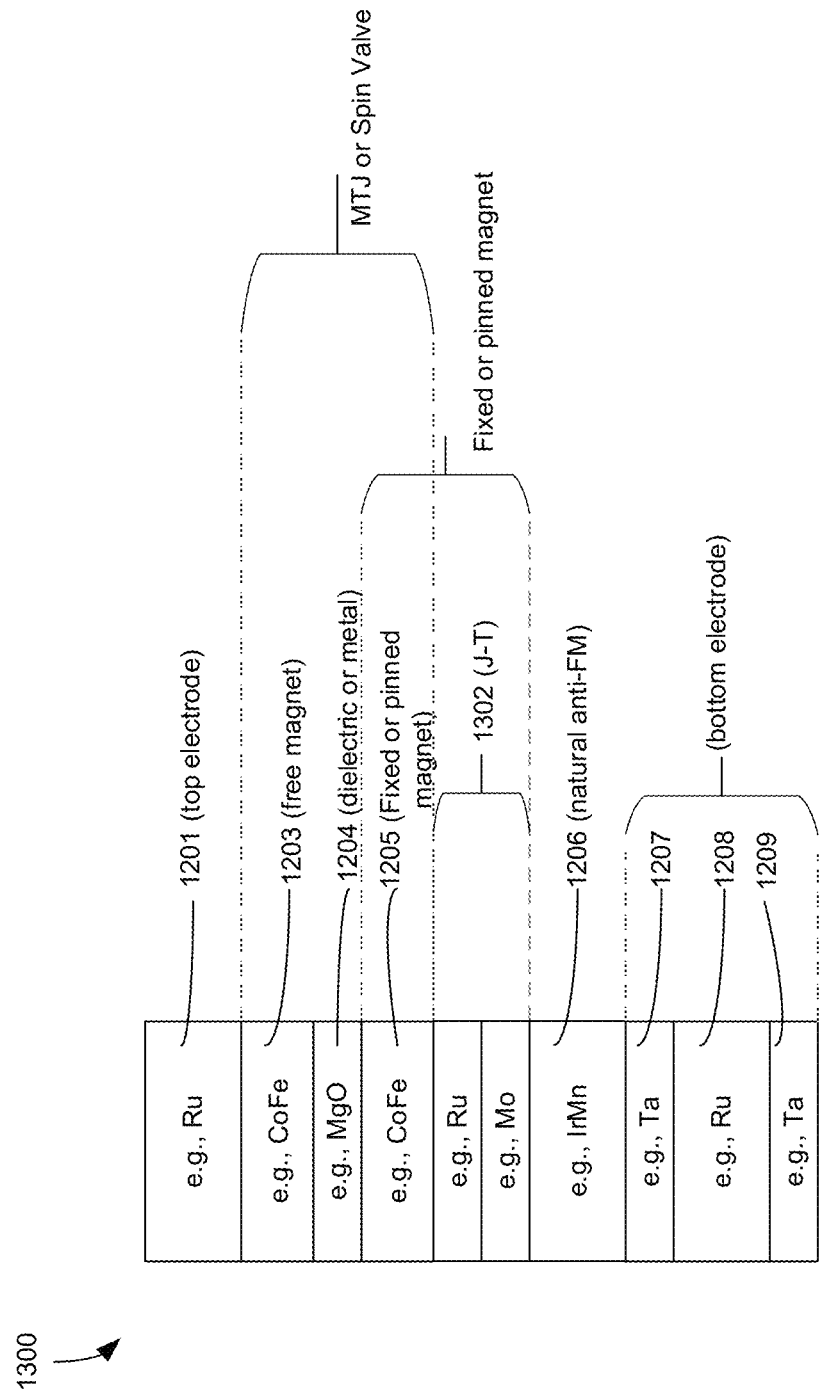
FIG. 13A illustrates a magnetic junction device having J-T materials adjacent to the fixed magnet of the magnetic junction, according to some embodiments of the disclosure.

FIG. 13A illustrates magnetic junction device 1300 having J-T materials adjacent to the fixed magnet of the magnetic junction, according to some embodiments of the disclosure. It is pointed out that those elements of FIG. 13A having the same reference numbers (or names) as the elements of any other figure can operate or function in any manner similar to that described, but are not limited to such. So as not to obscure the embodiments, differences between FIG. 13A and FIG. 12A are described.

In some embodiments, instead of section 1202, free magnet layer 1203 is directly coupled to top electrode 1201. In some embodiments, J-T material is coupled to the fixed or pinned magnet 1205. For example, a section 1302 is formed between the anti-ferromagnet (Anti-FM) 1206 and fixed magnet 1205. In some embodiments, section 1302 includes bcc-Ru which is coupled to fixed magnet 1205 and distorted by Mo to form bct-Ru. Here, bct-Ru is coupled to layer 1205 and layer of Mo is coupled to bct-Ru and anti-FM layer 1206. In some embodiments, the fixed magnet is formed by layer 1205 and section 1302 having J-T material.

Figure 13B:
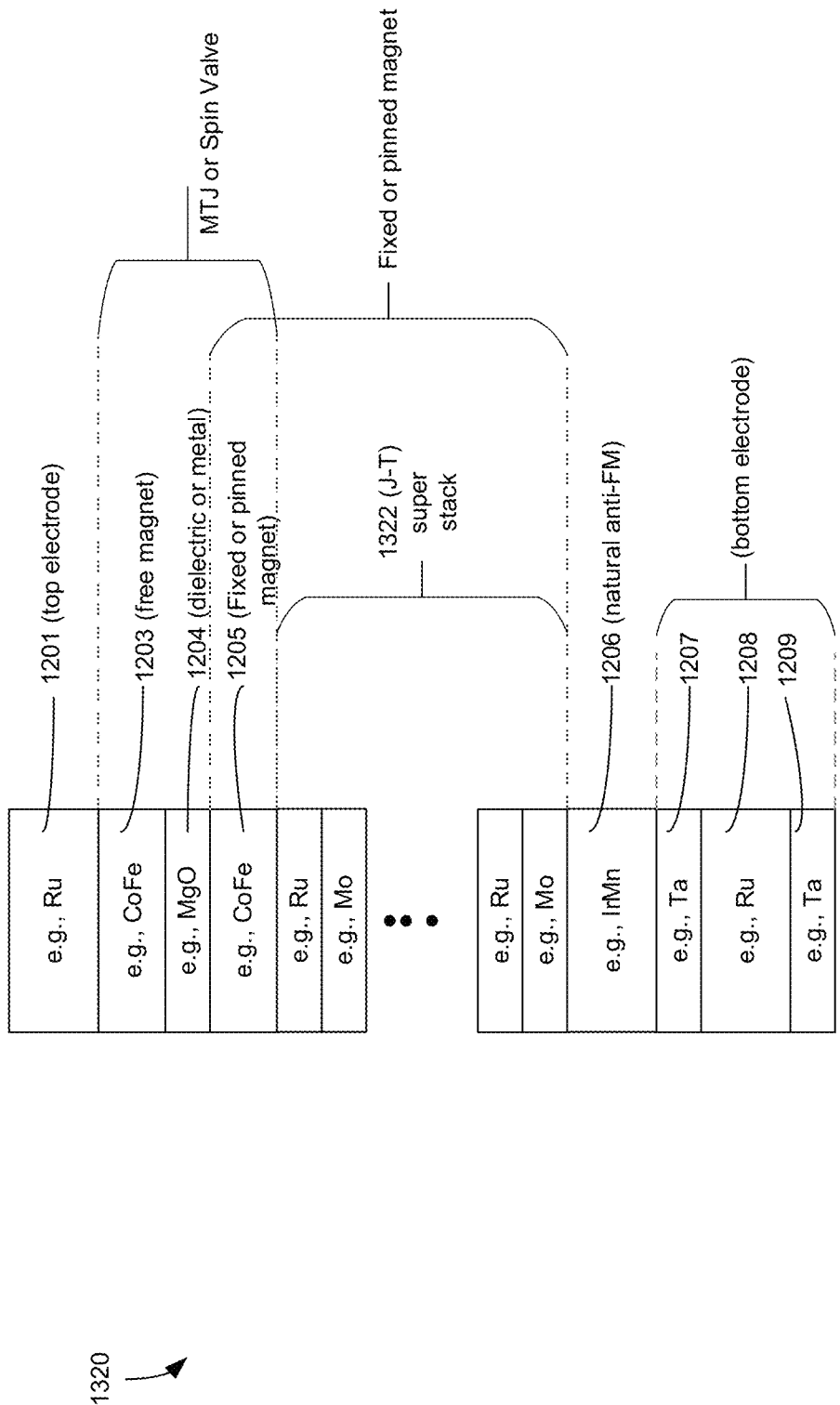
FIG. 13B illustrates a magnetic junction device having a super lattice stack of J-T materials adjacent to the fixed magnet of the magnetic junction, according to some embodiments of the disclosure.

FIG. 13B illustrates magnetic junction device 1300 having a super lattice stack of J-T materials adjacent to the fixed magnet of the magnetic junction, according to some embodiments of the disclosure. It is pointed out that those elements of FIG. 13B having the same reference numbers (or names) as the elements of any other figure can operate or function in any manner similar to that described, but are not limited to such. So as not to obscure the embodiments, differences between FIG. 13A and FIG. 13B are described.

In some embodiments, section 1302 of FIG. 13A can be replaced with a super-lattice stack of J-T materials 1322 (e.g., stack of Mo and bct-Ru). In some embodiments, super-lattice stack 1322 replaces fixed magnet 1205. In some embodiments, the fixed magnet is formed by layer 1205 and section 1322 having super-lattice stack of J-T materials.

Figure 14A:
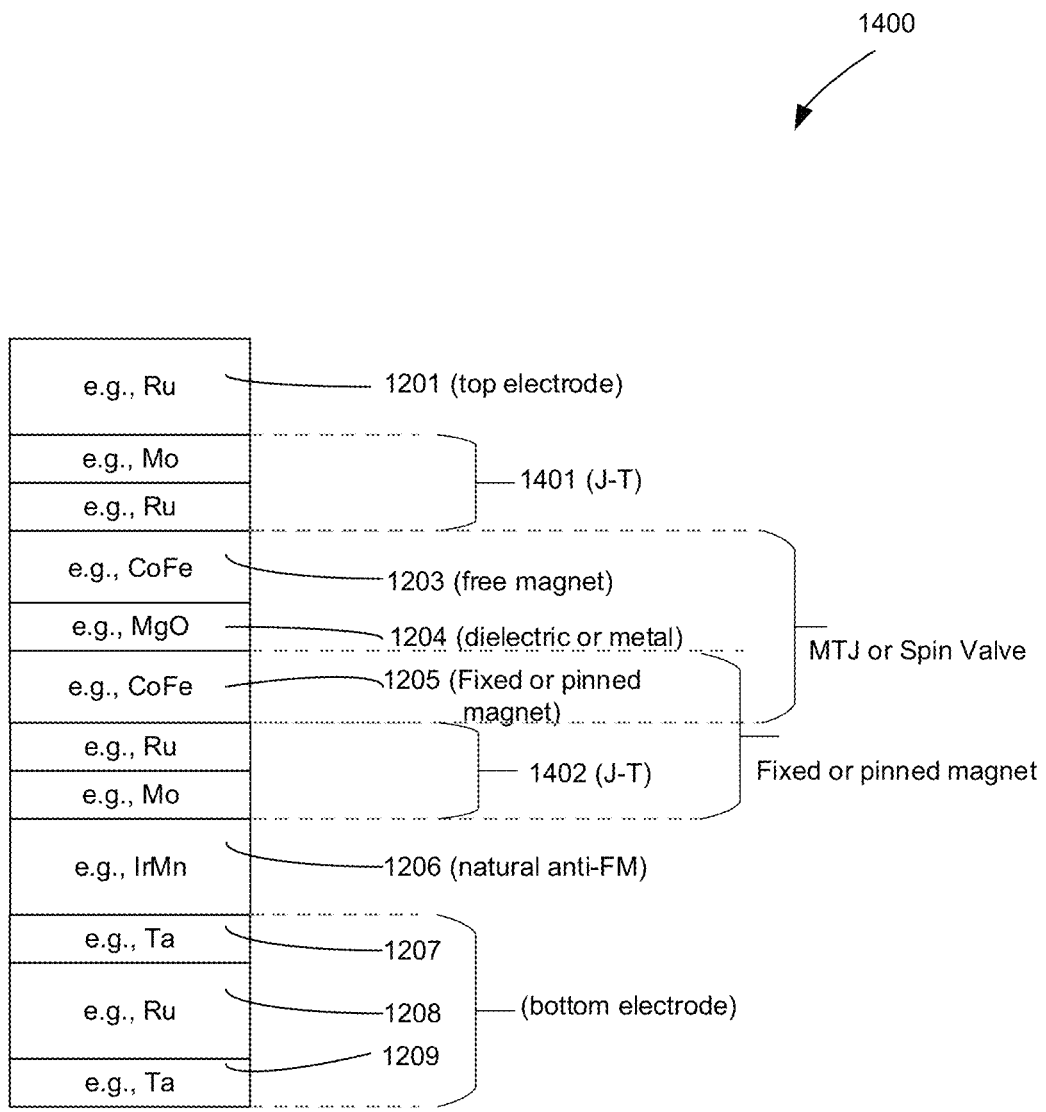
FIG. 14A illustrates a magnetic junction device having J-T materials adjacent to the free and fixed magnets of the magnetic junction, according to some embodiments of the disclosure.

FIG. 14A illustrates magnetic junction device 1400 having J-T materials adjacent to the free and fixed magnets of the magnetic junction, according to some embodiments of the disclosure. It is pointed out that those elements of FIG. 14A having the same reference numbers (or names) as the elements of any other figure can operate or function in any manner similar to that described, but are not limited to such. Magnetic junction device 1400 is a combination of embodiments of FIG. 12A and FIG. 13A.

In some embodiments, section 1401 (e.g., 1202) of J-T materials is formed between free magnet 1203 and top electrode 1201. As such, a new free magnet is formed by combination of 1203 and 1401. In some embodiments, section 1402 (e.g., 1302) of J-T materials is formed between fixed magnet 1205 and anti-FM 1206. As such, a new fixed magnet is formed by combination of 1205 and 1402.

Figure 14B:
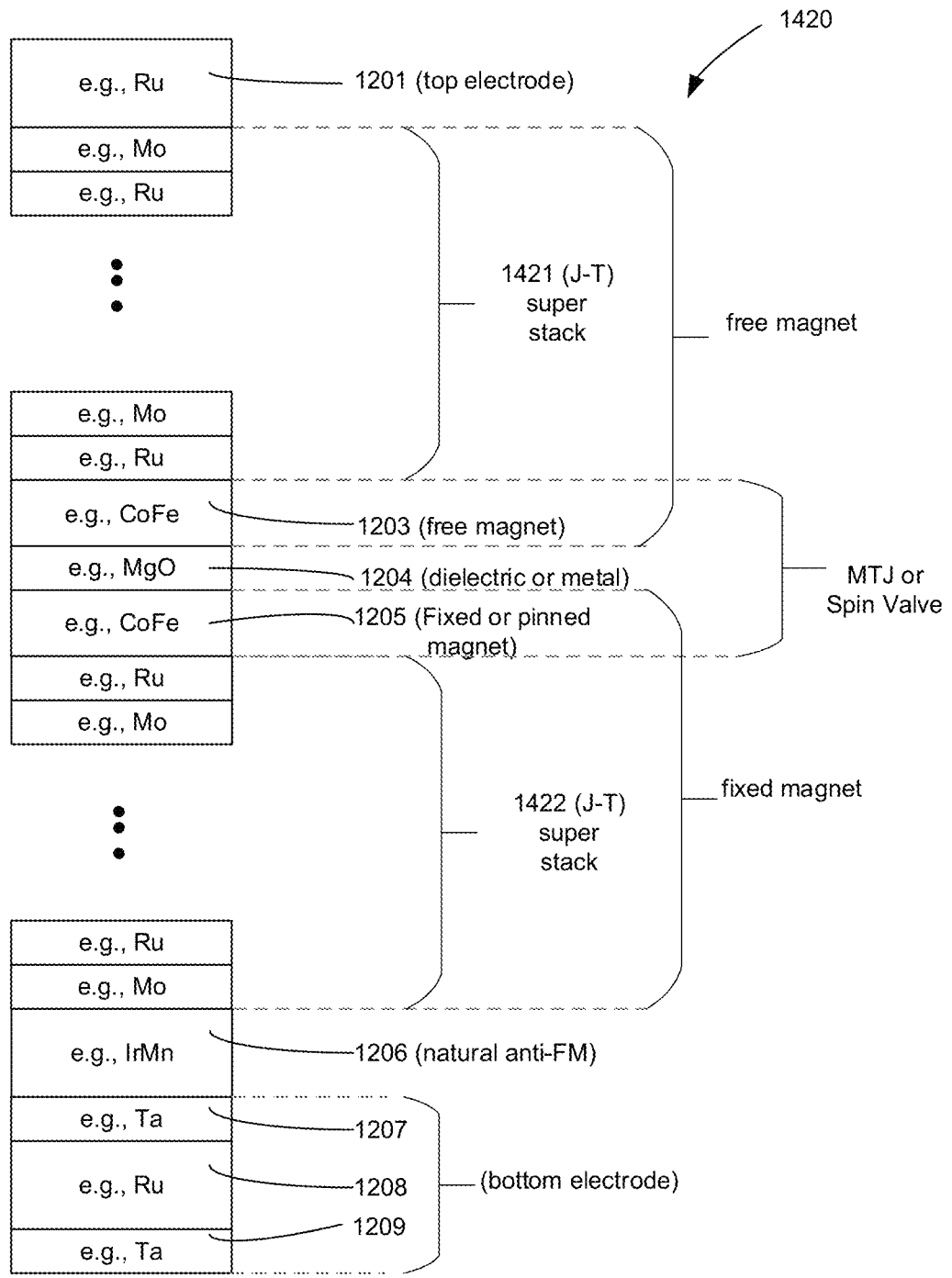
FIG. 14B illustrates a magnetic junction device having a super lattice stack of J-T materials adjacent to the free and fixed magnets of the magnetic junction, according to some embodiments of the disclosure.

FIG. 14B illustrates magnetic junction device 1420 having a super lattice stack of J-T materials adjacent to the free and fixed magnets of the magnetic junction, according to some embodiments of the disclosure. It is pointed out that those elements of FIG. 14B having the same reference numbers (or names) as the elements of any other figure can operate or function in any manner similar to that described, but are not limited to such. Magnetic junction device 1420 is a combination of embodiments of FIG. 12B and FIG. 13B.

In some embodiments, section 1421 (e.g., 1222) of super-lattice of J-T materials is formed between free magnet 1203 and top electrode 1201. As such, a new free magnet is formed by combination of 1203 and 1401. In some embodiments, section 1402 (e.g., 1322) of super-lattice of J-T materials is formed between fixed magnet 1205 and anti-FM 1206. As such, a new fixed magnet is formed by combination of 1205 and 1402.

Figure 15:
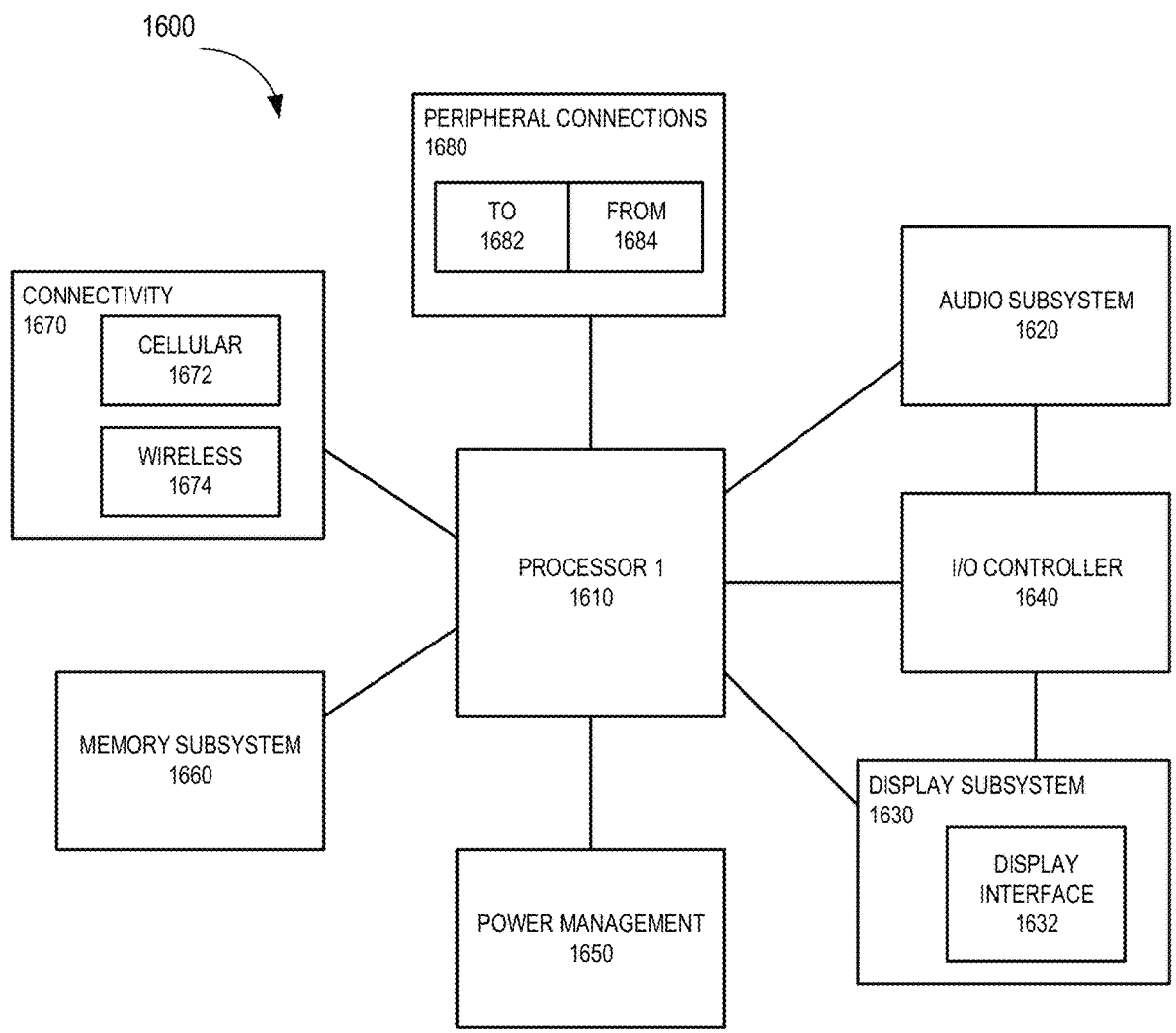
FIG. 15 illustrates a smart device or a computer system or a SoC (System-on-Chip) with a magnetic stack comprising of J-T materials for improving $H_k$ (e.g., increasing) and $M_s$ (e.g., lowering) according to some embodiments.

FIG. 15 illustrates a smart device or a computer system or a SoC (System-on-Chip) with a magnetic stack comprising of J-T materials for improving $H_k$ and $M_s$, according to some embodiments. It is pointed out that those elements of FIG. 15 having the same reference numbers (or names) as the elements of any other figure can operate or function in any manner similar to that described, but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 15 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 magnetic stack comprising of J-T materials for improving $H_k$ and $M_s$, according to some embodiments discussed. Other blocks of the computing device 1600 may also include the magnetic stack comprising of J-T materials for improving $H_k$ and $M_s$, according to some embodiments. The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600. In some embodiments, Memory subsystem 1660 includes the scheme of analog in-memory pattern matching with the use of resistive memory elements.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided which comprises: a heat spreading layer; a first transition metal layer adjacent to the heat spreading layer; and a magnetic recording layer adjacent to the first transition metal layer. In some embodiments, the apparatus comprises: a second transition metal layer adjacent to the magnetic recording layer such that the magnetic recording layer is sandwiched between the first and second transition metal layers. In some embodiments, the first transition metal layer is to produce a strain induced transition in the second transition metal layer. In some embodiments, the first or second transition metal layers are formed of a material selected from a group consisting of: Mo, Pd, Cr, and CoCrPt. In some embodiments, the Mo has a face centered cubic structure 110. In some embodiments, the apparatus comprises a substrate adjacent to the heat spreading layer. In some embodiments, the substrate is a glass substrate. In some embodiments, the apparatus comprises a cladding layer adjacent to the magnetic recording layer. In some embodiments, the cladding layer is formed of a material selected from a group consisting of: perfluoropolyether (PFPE), Z-Type Perfluoro Poly Ether Lubricant Polymer, Z-Dol 4000, Z-Tetroal, ZDol 7800, and Cyclotriphosphazenes. In some embodiments, the magnetic recording layer includes a plurality of magnetic components organized in an array configuration. In some embodiments, the magnetic recording layer is formed of a material selected from a group consisting of: Ru, Pt, and Pd.

In another example, a system is provided which comprises: a processor; a hard disk drive (HDD) communicatively coupled to the processor, the HDD having an apparatus according to the apparatus described above; and a wireless interface for allowing the processor to communicate with another device.

In another example, an apparatus is provided which comprises: a heat spreading layer; a first transition metal layer adjacent to the heat spreading layer; and a recording layer adjacent to the first transition metal layer, wherein the first transition metal layer is to interact with the transition metal layer causing Jahn-Teller distortion. In some embodiments, the apparatus comprises: a second transition metal layer adjacent to the magnetic recording layer such that the magnetic recording layer is sandwiched between the first and second transition metal layers. In some embodiments, the first transition metal layer is to produce a strain induced transition in the second transition metal layer. In some embodiments, the first or second transition metal layers are formed of a material selected from a group consisting of: Mo, Pd, Cr, and CoCrPt. In some embodiments, the Mo has a face centered cubic structure 110. In some embodiments, the apparatus comprises a substrate adjacent to the heat spreading layer. In some embodiments, the substrate is a glass substrate. In some embodiments, the apparatus comprises a cladding layer adjacent to the magnetic recording layer. In some embodiments, the cladding layer is formed of a material selected from a group consisting of: perfluoropolyether (PFPE), Z-Type Perfluoro Poly Ether Lubricant Polymer, Z-Dol 4000, Z-Tetroal, ZDol 7800, and Cyclotriphosphazenes. In some embodiments, the magnetic recording layer includes a plurality of magnetic components organized in an array configuration. In some embodiments, the magnetic recording layer is formed of a material selected from a group consisting of: Ru, Pt, and Pd.

In another example, a system is provided which comprises: a processor; a hard disk drive (HDD) communicatively coupled to the processor, the HDD having an apparatus according to the apparatus described above; and a wireless interface for allowing the processor to communicate with another device.

In another example, an apparatus is provided which comprises: an input magnet formed of a body centered tetragonal (bct) Jahn-Teller material; a first interface layer adjacent to the input magnet; and a second interface layer adjacent to the input magnet, the second interface layer formed of a transition metal which is to interact with the input magnet causing Jahn-Teller distortion. In some embodiments, the bct Jahn-Teller material is bct-Ru. In some embodiments, the first interface layer is formed of a non-magnetic material such that the first interface layer and the input magnet together have sufficiently matched atomistic crystalline layers. In some embodiments, the non-magnetic material is Ag or Ag-like material. In some embodiments, the sufficiently matched atomistic crystalline layers are matched within 4% which is low enough to not cause lattice mismatch. In some embodiments, the transition metal is Mo. In some embodiments, the apparatus comprises: a ground layer adjacent to the second interface layer. In some embodiments, the apparatus comprises: a first spin channel adjacent to the first interface layer; and an interconnect layer for providing power supply, wherein the interconnect layer is adjacent to the first spin channel through a via. In some embodiments, the first spin channel is partially adjacent to the first interface. In some embodiments, the apparatus comprises: a second spin channel which is partially adjacent to the first interface, and wherein the first and second spin channels are separated by an insulator; and a third spin channel adjacent to the first and second spin channels and the first interface.

In another example, a system is provided which comprises: a memory; a processor coupled to a memory, the processor having an apparatus according to the apparatus described above; and a wireless interface for allowing the processor to communicate with another device.

In some embodiments, an apparatus is provided which comprises: a first electrode; a magnetic junction having a free magnet; and one or more layers of Jahn Teller material adjacent to the first electrode and the free magnet of the magnetic junction. In some embodiments, the magnetic junction includes a fixed magnet. In some embodiments, the free and fixed magnets are formed of a Heusler alloy. In some embodiments, the Heusler alloy is formed of a materials selected from a group consisting of: $Co_2FeAl$, $Co_2FeGeGa$, $Cu_2MnAl$, $Cu_2MnIn$, $Cu_2MnSn$, $Ni_2MnAl$, $Ni_2MnIn$, $Ni_2MnSn$, $Ni_2MnSb$, $Ni_2MnGa$, $Co_2MnAl$, $Co_2MnSi$, $Co_2MnGa$, $Co_2MnGe$, $Pd_2MnAl$, $Pd_2MnIn$, $Pd_2MnSn$, $Pd_2MnSb$, $Co_2FeSi$, $Fe_2VAl$, $Mn_2VGa$, or $Co_2FeGe$. In some embodiments, the apparatus comprises: a anti-ferromagnet layer adjacent to the fixed magnet; and a second electrode adjacent to the anti-ferromagnet layer. In some embodiments, the magnetic junction includes a dielectric adjacent to the fixed magnet and the free magnet, and wherein the magnetic junction is a magnetic tunnel junction (MTJ). In some embodiments, the magnetic junction includes a metal adjacent to the fixed magnet and the free magnet, and wherein the magnetic junction is a spin valve. In some embodiments, the one or more layers of Jahn-Teller material include a layer of Ru adjacent to a layer of Mo and the free magnet. In some embodiments, the one or more layers of Jahn Teller material include a stack of at least two pairs of layers where each pair includes a layer of Mo and a layer of Ru.

In another example, an apparatus is provided which comprises: a first electrode; a anti-ferromagnet layer adjacent to the first electrode; a magnetic junction having a fixed magnet; and one or more layers of Jahn Teller material adjacent to the anti-ferromagnet and the fixed magnet of the magnetic junction. In some embodiments, the magnetic junction includes a free magnet. In some embodiments, the apparatus comprises a second electrode adjacent to the free magnet. In some embodiments, the magnetic junction includes a dielectric adjacent to the fixed magnet and the free magnet, and wherein the magnetic junction is a magnetic tunnel junction (MTJ). In some embodiments, the magnetic junction includes a metal adjacent to the fixed magnet and the free magnet, and wherein the magnetic junction is a spin valve. In some embodiments, the one or more layers of Jahn Teller material include a layer of Ru adjacent to the fixed magnet and to a layer of Mo, wherein the layer of Mo is adjacent to the anti-ferromagnet layer. In some embodiments, the one or more layers of Jahn Teller material include a stack of at least two pairs of layers where each pair includes a layer of Mo and a layer of Ru.

In another example, an apparatus is provided which comprises: means for spreading heat; means for producing strain induced transition in a transition metal layer; and means for recording data, wherein the means for recording data is adjacent to the transition metal layer. In some embodiments, the means for producing strain induced transition is to interact with the transition metal layer causing Jahn-Teller distortion. In some embodiments, the second transition metal layer is adjacent to the means for recording data such that means for recording data is sandwiched between the means for producing strain induced transition and transition metal layer. In some embodiments, the means for producing strain induced transition or the transition metal layers are formed of a material selected from a group consisting of: Mo, Pd, Cr, and CoCrPt. In some embodiments, the Mo has a face centered cubic structure 110. In some embodiments, the substrate is a glass substrate. In some embodiments, the apparatus comprises a substrate adjacent to the means for spreading heat. In some embodiments, the apparatus comprises means for protecting the means for recording data. In some embodiments, the means for protecting is formed of a material selected from a group consisting of: perfluoropolyether (PFPE), Z-Type Perfluoro Poly Ether Lubricant Polymer, Z-Dol 4000, Z-Tetroal, ZDol 7800, and Cyclotriphosphazenes. In some embodiments, the means for recording includes a plurality of magnetic components organized in an array configuration. In some embodiments, the means for recording is formed of a material selected from a group consisting of: Ru, Pt, and Pd.

In another example, a system is provided which comprises: a processor; a hard disk drive (HDD) communicatively coupled to the processor, the HDD having an apparatus according to the apparatus described above; and a wireless interface for allowing the processor to communicate with another device.

In another example, a method is provided which comprises: producing strain induced transition in a transition metal layer; and magnetically recording data according to the strain induced transition in the transition metal layer; and spreading heat from the process of magnetically recording data. In some embodiments, producing strain induced transition comprises interacting with the transition metal layer causing Jahn-Teller distortion. In some embodiments, the transition metal layer is formed of a material selected from a group consisting of: Mo, Pd, Cr, and CoCrPt. In some embodiments, the Mo has a face centered cubic structure 110. In some embodiments, the method comprises protecting a layer which is to magnetically record data. In some embodiments, protecting the layer comprises using a material selected from a group consisting of: perfluoropolyether (PFPE), Z-Type Perfluoro Poly Ether Lubricant Polymer, Z-Dol 4000, Z-Tetroal, ZDol 7800, and Cyclotriphosphazenes.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first structure to provide heat spreading;
   a second structure comprising transition metal, wherein the second structure is adjacent to the first structure, and wherein the second structure comprises Mo that has a face centered cubic structure (110);
   a third structure comprising magnetic material, wherein the third structure is directly adjacent to the second structure; and
   a fourth structure including a transition metal, wherein the fourth structure is adjacent to the third structure such that the third structure is between the second and fourth structures, and wherein the fourth structure comprises Mo that has a face centered cubic structure (110).

2. The apparatus of claim 1, wherein the second structure is configured to produce a strain induced transition in the fourth structure.

3. The apparatus of claim 1 comprises a substrate adjacent to the first structure.

4. The apparatus of claim 3, wherein the substrate comprises a glass substrate.

5. The apparatus of claim 1 comprises a fifth structure adjacent to the third structure, wherein the fifth structure comprises a cladding material.

6. The apparatus of claim 5, wherein the cladding material includes one of: perfluoropolyether (PFPE), Z-Type Perfluoro Poly Ether Lubricant Polymer, Z-Dol 4000, Z-Tetroal, ZDol 7800, or Cyclotriphosphazenes.

7. The apparatus of claim 1, wherein the third structure includes a plurality of magnetic components organized in an array configuration.

8. The apparatus of claim 1, wherein the third structure includes one of: Ru, Pt, or Pd.

9. An apparatus comprising:
   a heat spreading layer;
   a transition metal layer adjacent to the heat spreading layer, wherein the transition metal includes Mo that has a face centered cubic structure (110); and
   a recording layer directly adjacent to the transition metal layer, wherein the transition metal layer is configured to interact with the recording layer causing Jahn-Teller distortion.

10. The apparatus of claim 9, wherein the transition metal layer is a first transition metal layer, wherein the apparatus comprises a second transition metal layer adjacent to the recording layer such that the recording layer is between the first and second transition metal layers, and wherein the first transition metal layer is to produce a strain induced transition in the second transition metal layer.

11. The apparatus of claim 10, wherein the second transition metal layer includes a material which includes one of: Mo, Pd, Cr, or CoCrPt, and wherein when the material is Mo, the Mo has a face centered cubic structure (110).

12. The apparatus of claim 9 comprises:
   a substrate adjacent to the heat spreading layer, wherein the substrate is a glass substrate; and
   a cladding layer adjacent to the recording layer.

13. The apparatus of claim 12, wherein the cladding layer includes one of: perfluoropolyether (PFPE), Z-Type Perfluoro Poly Ether Lubricant Polymer, Z-Dol 4000, Z-Tetroal, ZDol 7800, or Cyclotriphosphazenes.

14. The apparatus of claim 9, wherein the recording layer includes a plurality of magnetic components organized in an array configuration.

15. The apparatus of claim 9, wherein the recording layer includes one of: Ru, Pt, or Pd.

16. A system comprising:
   a processor;
   a hard disk drive (HDD) communicatively coupled to the processor, the HDD having an apparatus which comprises:
      a heat spreading layer;
      a first transition metal layer adjacent to the heat spreading layer, wherein the transition metal comprises Mo that has a face centered cubic structure (110);
      a magnetic recording layer directly adjacent to the transition metal layer; and
      a second transition metal layer adjacent to the magnetic recording layer such that the magnetic recording layer is between the first and second transition metal layers, wherein the second transition metal layer comprises Mo that has a face centered cubic structure (110); and
   a wireless interface to allow the processor to communicate with another device.

17. The system of claim 16, wherein the first transition metal layer is configured to produce a strain induced transition in the second transition metal layer.

* * * * *